United States Patent
Lee et al.

(10) Patent No.: US 8,742,488 B2
(45) Date of Patent: Jun. 3, 2014

(54) THREE-DIMENSIONAL SEMICONDUCTOR MEMORY DEVICES AND METHODS OF FABRICATING THE SAME

(75) Inventors: Jaegoo Lee, Suwon-si (KR); Kil-Su Jeong, Suwon-si (KR); Hansoo Kim, Suwon-si (KR); Youngwoo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/366,818

(22) Filed: Feb. 6, 2012

(65) Prior Publication Data

US 2012/0205722 A1    Aug. 16, 2012

(30) Foreign Application Priority Data

Feb. 16, 2011    (KR) .......................... 10-2011-0013780

(51) Int. Cl.
*H01L 23/52*    (2006.01)
(52) U.S. Cl.
USPC ........... 257/324; 257/321; 257/319; 257/316; 257/211; 257/773; 257/E27.098; 257/E29.255; 257/E21.294; 257/E29.309; 257/E23.141; 438/257; 365/185.05
(58) Field of Classification Search
USPC ...................... 257/324, 321, 319; 365/185.05
See application file for complete search history.

(56) References Cited

U.S. PATENT DOCUMENTS

| | | | |
|---|---|---|---|
| 2008/0315296 A1 | 12/2008 | Tanaka et al. | |
| 2010/0163968 A1 | 7/2010 | Kim et al. | |
| 2010/0207194 A1 | 8/2010 | Tanaka et al. | |
| 2010/0320528 A1* | 12/2010 | Jeong et al. ................... | 257/324 |

FOREIGN PATENT DOCUMENTS

| | | |
|---|---|---|
| JP | 2009-004517 A | 1/2009 |
| JP | 2010-157734 A | 7/2010 |
| JP | 2010-192569 A | 9/2010 |
| KR | 20100079393 A | 7/2010 |
| KR | 2010-0094384 A | 8/2010 |

\* cited by examiner

*Primary Examiner* — Jerome Jackson, Jr.
*Assistant Examiner* — Bo Fan
(74) *Attorney, Agent, or Firm* — Harness Dickey & Pierce, P.L.C.

(57) ABSTRACT

Example embodiments relate to a three-dimensional semiconductor memory device including an electrode structure on a substrate, the electrode structure including at least one conductive pattern on a lower electrode, and a semiconductor pattern extending through the electrode structure to the substrate. A vertical insulating layer may be between the semiconductor pattern and the electrode structure, and a lower insulating layer may be between the lower electrode and the substrate. The lower insulating layer may be between a bottom surface of the vertical insulating layer and a top surface of the substrate. Example embodiments related to methods for fabricating the foregoing three-dimensional semiconductor memory device.

19 Claims, 19 Drawing Sheets

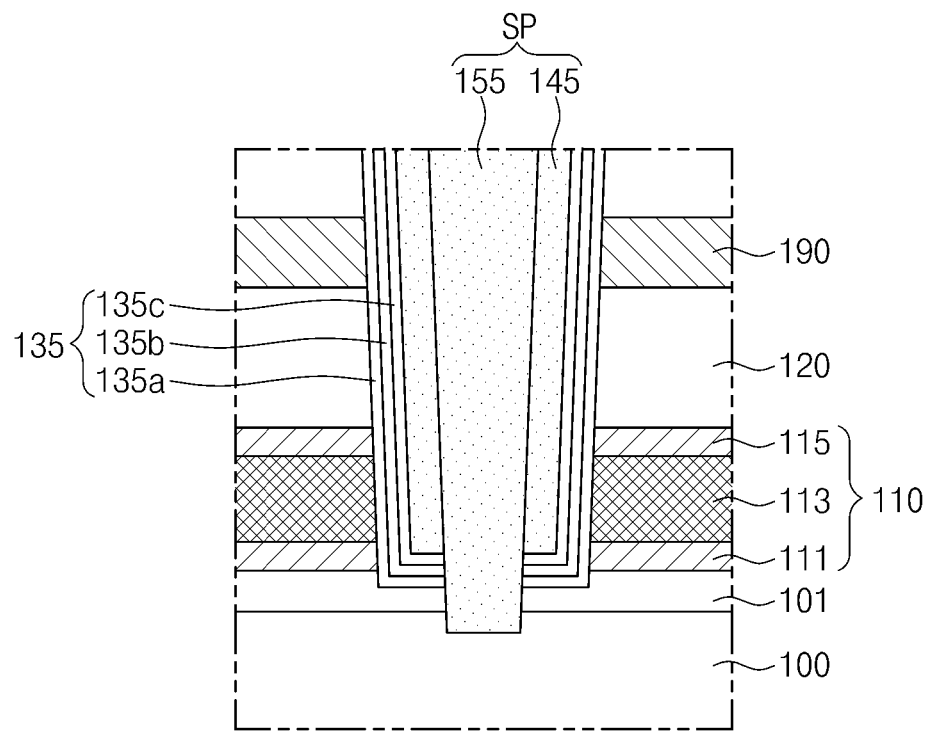

THREE-DIMENSIONAL SEMICONDUCTOR MEMORY DEVICES AND METHODS OF FABRICATING THE SAME

CROSS-REFERENCE TO RELATED APPLICATIONS

This U.S. non-provisional patent application claims priority under 35 U.S.C. §119 to the benefit of Korean Patent Application No. 10-2011-0013780, filed on Feb. 16, 2011, in the Korean Intellectual Property Office, the entire contents of which are incorporated herein by reference.

BACKGROUND OF THE INVENTION

Example embodiments of inventive concepts relate generally to a semiconductor memory device and/or to a method of fabricating the same. More particularly, example embodiments of inventive concepts relate to a three-dimensional semiconductor memory device including three-dimensionally arranged memory cells and/or to a method of fabricating the same.

Higher integration of semiconductor memory devices is desired to satisfy consumer demands for superior performance and inexpensive prices. In the case of semiconductor memory devices, since their integration may affect product prices, increased integration is desired. In the case of typical two-dimensional or planar semiconductor memory devices, their integration may be determined by the area occupied by a unit memory cell. Thus, integration may be influenced by fine pattern forming technology. However, process equipment for increasing pattern fineness may be very expensive and therefore can set a practical limitation on increasing integration for two-dimensional or planar semiconductor memory devices.

There is interest in three-dimensional semiconductor memory devices having three-dimensionally arranged memory cells. However, in order to send three-dimensional semiconductor memory devices into mass-production, a new process technology is being developed to provide a lower manufacturing cost per bit than two-dimensional memory devices and good reliability.

SUMMARY

Example embodiments of inventive concepts relate to three-dimensional semiconductor memory devices with improved reliability and increased productivity.

Example embodiments of inventive concepts relate to methods of fabricating a three dimensional semiconductor memory device with good reliability and increased productivity.

According to example embodiments of inventive concepts, a three-dimensional semiconductor memory device includes an electrode structure on a substrate, the electrode structure including at least one conductive pattern on a lower electrode, a semiconductor pattern extending through the electrode structure to the substrate, a vertical insulating layer between the semiconductor pattern and the electrode structure, and a lower insulating layer between the lower electrode and the substrate. The lower insulating layer may be between a bottom surface of the vertical insulating layer and a top surface of the substrate.

A horizontal insulating layer may be between the vertical insulating layer and the at least one conductive pattern. The horizontal insulating layer may cover a top and a bottom surface of the at least one conductive pattern.

The lower electrode may include a plurality of conductive layers stacked in a vertical direction.

A vertical thickness of the lower electrode may be greater than a vertical thickness of the at least one conductive pattern.

The lower electrode may include a first conductive layer, a second conductive layer on the first conductive layer, and a third conductive layer on the second conductive layer. The second conductive layer may include a conductive material having an electric resistivity smaller than an electric resistivity of the first and third conductive layers.

The lower electrode may include a layer containing at least one of doped silicon, metallic materials, metal nitrides, and metal silicides.

A thickness of the lower insulating layer may be smaller below the vertical insulating layer than a thickness of the lower insulating layer below the lower electrode.

A spacer portion may be inserted into the vertical insulating layer. A body portion may be inserted into the spacer portion. The body portion may be in direct contact with the substrate. A bottom surface of the body portion may be located at a vertical level that is lower than a bottom surface of the spacer portion.

A bottom portion of the vertical insulating layer may be between the lower insulating layer and the spacer portion. A vertical portion of the vertical insulating layer may be in contact with a sidewall of the spacer portion.

A bottom surface of the body portion may be in direct contact with the substrate. A bottom surface of the spacer potion may be spaced apart from the substrate.

A bottom surface of the body portion may be located at a vertical level that is lower than an uppermost surface of the substrate.

According to example embodiments of inventive concepts, a method of fabricating a three-dimensional semiconductor memory device may include forming a lower insulating layer and a lower conductive structure on a substrate, forming a mold structure including insulating layers and sacrificial layers alternatingly stacked on the lower conductive structure, forming an opening to penetrate the mold structure and the lower conductive structure and expose the lower insulating layer, sequentially forming a vertical insulating layer and a first semiconductor layer to cover an inner wall of the opening, forming a through hole to expose the substrate below the opening, the through hole penetrating the first semiconductor layer, the vertical insulating layer and the lower insulating layer, and forming a second semiconductor layer in the through hole to connect the substrate with the first semiconductor layer.

The forming the lower conductive structure may include sequentially stacking a first conductive layer, a second conductive layer, and a third conductive layer. The second conductive layer may contain a conductive material including an electric resistivity that is smaller than an electric resistivity of the first and third conductive layers. A vertical thickness of the lower conductive structure may be greater than a vertical thickness of the sacrificial layers.

A total deposition thickness of the vertical insulating layer and the first semiconductor layer is smaller than a width of the opening. The forming the through holes may include anisotropically etching the first semiconductor layer to form a semiconductor spacer exposing a top surface of the vertical insulating layer at a bottom of the opening, and anisotropically etching the vertical insulating layer and the lower insulating layer exposed by the semiconductor spacer.

After forming the second semiconductor layer, the method may further include forming a trench that exposes the lower conductive structure, the trench being spaced apart from the first and second semiconductor layers, removing the sacrificial layers exposed by the trench to form recess regions between the insulating layers, sequentially forming a horizontal insulating layer and a conductive pattern to fill the recess regions, and removing a portion of the lower conductive structure under the trench to expose the substrate.

According to example embodiments of inventive concepts, a three-dimensional semiconductor memory device may include a lower insulating pattern on a substrate, and a plurality of cell strings extending vertically between the substrate and a bit line. Each of the cell strings may include a semiconductor body extending vertically between the substrate and the bit line, a vertical insulating layer on the lower insulating pattern, the vertical insulating layer surrounding the semiconductor body, and a plurality of insulator elements and gate electrodes alternately stacked on the lower insulating pattern.

Each of the plurality of cell strings may include a lower electrode structure between the lower insulating pattern and the plurality of insulator elements and gate electrodes alternately stacked. The lower electrode structure may form a ground selection transistor with a portion of the semiconductor body and a portion of the vertical insulating layer.

Each of the plurality of cell strings may include a horizontal insulating pattern including a plurality of horizontal insulating elements. Each horizontal insulating element may cover at least two surface of the gate electrodes.

Each of the plurality of cell strings may include a semiconductor spacer between the semiconductor body and the vertical insulating layer.

According to example embodiments, a system may include a memory controller operably connected to the foregoing three-dimensional semiconductor memory device.

BRIEF DESCRIPTION OF THE DRAWINGS

Example embodiments will be more clearly understood from the following brief description taken in conjunction with the accompanying drawings. FIGS. 1 through 17 represent non-limiting, example embodiments as described herein.

FIG. 1 is a schematic circuit diagram of a three-dimensional semiconductor memory device according to example embodiments of inventive concepts;

FIG. 2 is a perspective view of a three-dimensional semiconductor memory device according to example embodiments of inventive concepts;

FIGS. 3 and 4 are perspective views of three-dimensional semiconductor memory devices according to other example embodiments of the inventive concepts;

FIG. 5A through FIG. 5E are enlarged sectional view of a portion A of FIG. 2;

FIGS. 6 through 14 are sectional views illustrating a method of fabricating a three-dimensional semiconductor memory device according to example embodiments of inventive concepts;

FIG. 15 is a block diagram exemplarily illustrating a memory system including a three-dimensional semiconductor memory device according to example embodiments of inventive concepts;

FIG. 16 is a block diagram exemplarily illustrating a memory card including a three-dimensional semiconductor memory device according to example embodiments of inventive concepts; and FIG. 17 is a block diagram exemplarily illustrating an information processing system including a three-dimensional semiconductor memory device according to example embodiments of inventive concepts.

Figure 1:
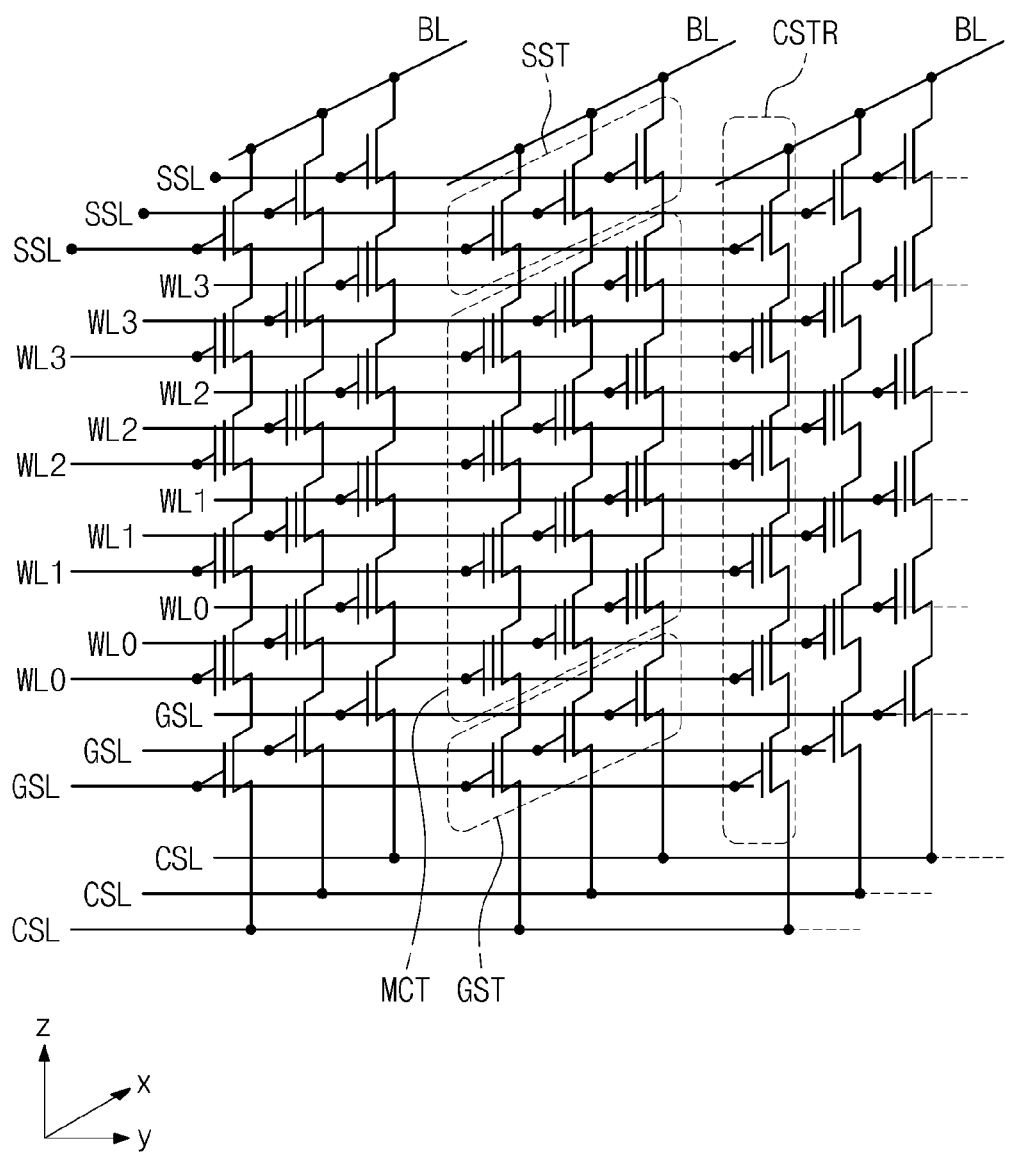

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of like elements or features throughout the different views.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram of a cell array region of a three-dimensional semiconductor memory device according to example embodiments of inventive concepts.

Referring to FIG. 1, a three-dimensional semiconductor memory device may include a cell array region, in which a common source line CSL, and a plurality of bit lines BL, and a plurality of cell strings CSTR interposed between the common source line CSL and the bit lines BL.

The bit lines may be two-dimensionally arranged and a plurality of the cell strings CSTR may be connected in parallel to each of the bit lines BL. The cell strings CSTR may be connected in common to the common source line CSL. That is, the plurality of the cell strings CSTR may be disposed between the common source line CSL and one of the bit lines BL. According to example embodiments of inventive concepts, the cell array region may include a plurality of two-dimensionally arranged common source lines CSL. According to example embodiments of inventive concepts, the common source lines CSL may be connected with each another and be in an equipotential state. According to example embodiments of inventive concepts, the common source lines CSL may be separated from each another such that they can be controlled independently.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. The ground selection transistor GST, the memory cell transistors MCT, and the string selection transistor SST may be connected in series.

Sources regions of the ground selection transistors GST may be connected in common to the common source line CSL. In addition, at least one ground selection line GSL, a plurality of word lines WL0 to WL3, and a plurality of string selection lines SSL may be disposed between the common source line CSL and the bit lines BL to serve as gate electrodes of the ground selection transistor GST, the memory cell transistors MCT, and the string selection transistors SST, respectively. Furthermore, each of the memory cell transistors MCT may include a data storage element or a memory element.

Figure 2:
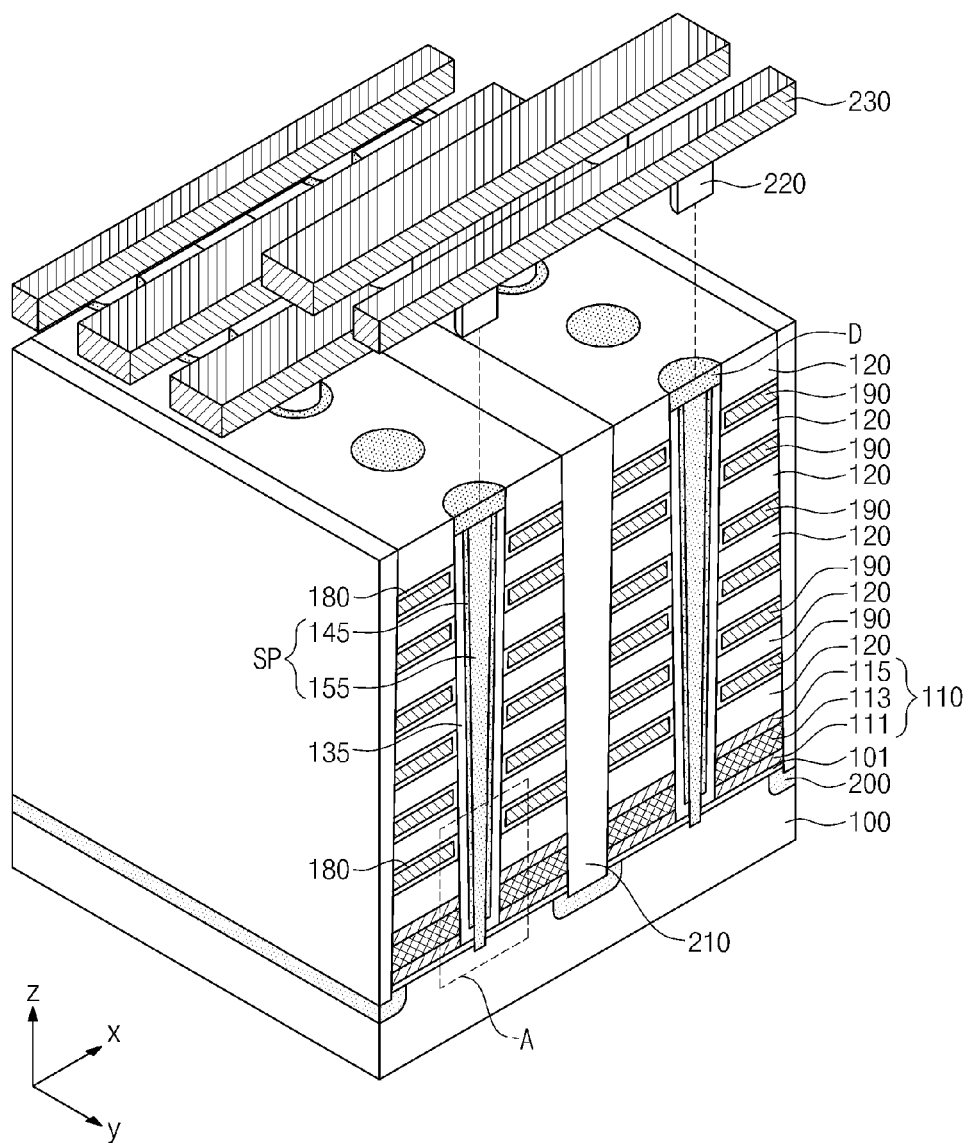

Referring to FIG. 2, electrode structures may be provided on a substrate 100, and semiconductor patterns SP may penetrate the electrode structure and be connected to the substrate 100. The electrode structure may include a lower electrode structure 110, insulating patterns 120, and conductive patterns 190. The insulating patterns 120 and the conductive patterns 190 may be alternatingly stacked on the lower electrode structure 110. The electrode structure may be formed to have a line shape extending parallel to a top surface (or xy-plane) of the substrate 100. Each of the conductive patterns 190 may surround the corresponding one of the semiconductor patterns SP or cross the semiconductor patterns SP in a horizontal direction.

A lower insulating layer 101 may be interposed between the electrode structure and the substrate 100. For instance, the lower insulating layer 101 may be a silicon oxide layer formed by a thermal oxidation and have a thickness ranging from about 10 angstrom to 100 angstrom.

The lower electrode structure 110 may include a conductive layer or a plurality of conductive layers and have a vertical thickness greater than the conductive pattern 190.

Figure 5A:
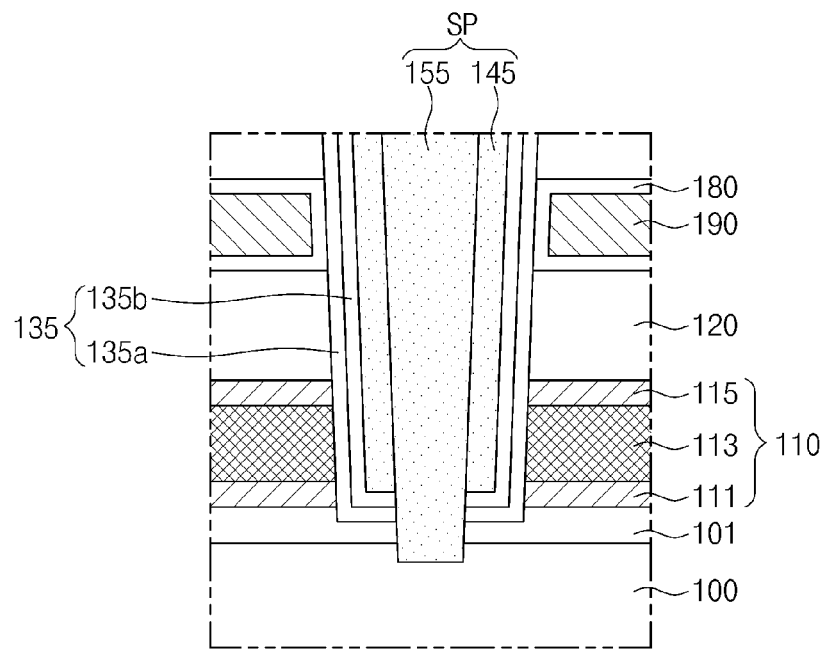

According to example embodiments of inventive concepts, the lower electrode structure 110 may include a first conductive layer 111, a second conductive layer 113, and a third conductive layer 115, which are sequentially stacked on the substrate 100, as shown in FIG. 5A. The first and third conductive layers 111 and 115 may be formed of conductive materials having an etch selectivity with respect to the second conductive layer 113 and be thinner than the second conductive layer 113. The second conductive layer 113 may be formed of a material having electric resistivity lower than the first and third conductive layers 111 and 115. For instance, the first and third conductive layers 111 and 115 may include a doped polysilicon layer and the second conductive layer 113 may include at least one of a metal layer and/or a metal silicide layer. Alternatively, the first and third conductive layers 111 and 115 may include a metallic barrier layer, such as a titanium nitride layer or a tantalum nitride layer, and the second conductive layer 113 may include a metal layer (e.g., of tungsten).

Figure 5B:
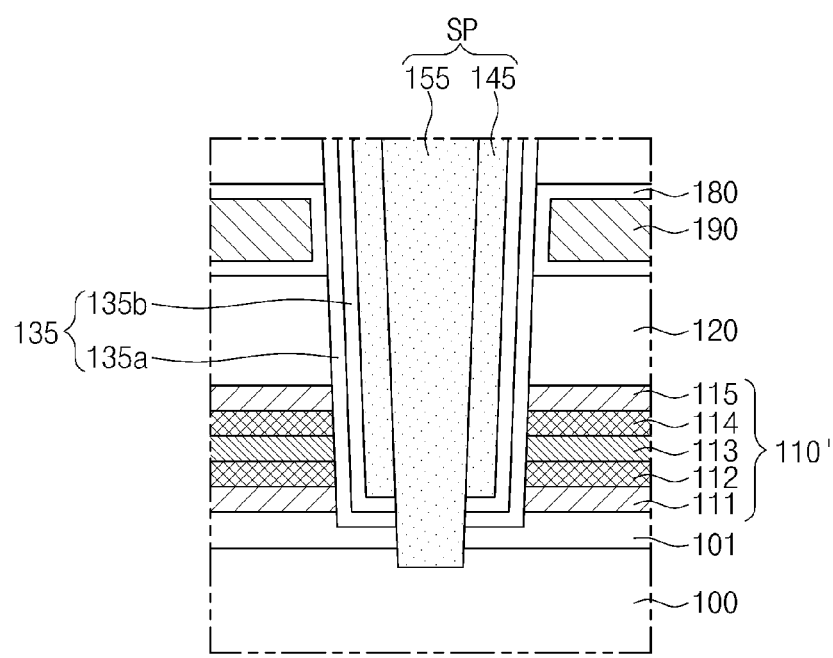
Figure 5C:
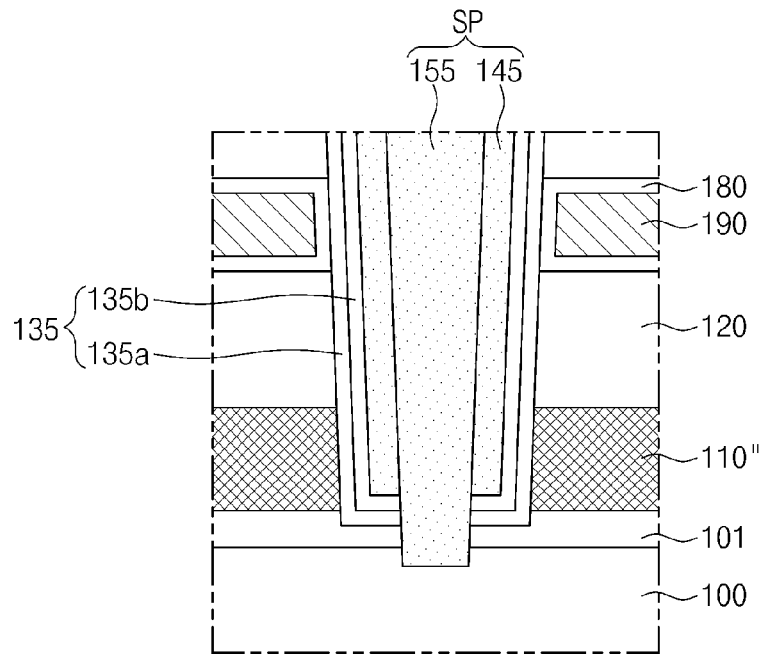

According to example embodiments of inventive concepts, the lower electrode structure 110' may include lower and upper polysilicon layers 111 and 115, a metal layer 113 interposed between the lower and upper polysilicon layers 111 and 115, and silicide layers 112 and 114 interposed between the metal layer 113 and the lower and upper polysilicon layers 111 and 115, respectively, as shown in FIG. 5B. According to example embodiments, the lower electrode structure 110" may be a single layer formed of one of poly-silicon, metal silicide, metal, and/or conductive metal nitride, as shown in FIG. 5C.

The conductive patterns 190 may include at least one of a doped silicon layer, a metal layer, a metal nitride layer, and/or a metal silicide layer. For example, the conductive pattern 190 may be formed of tantalum nitride or tungsten.

Figure 3:
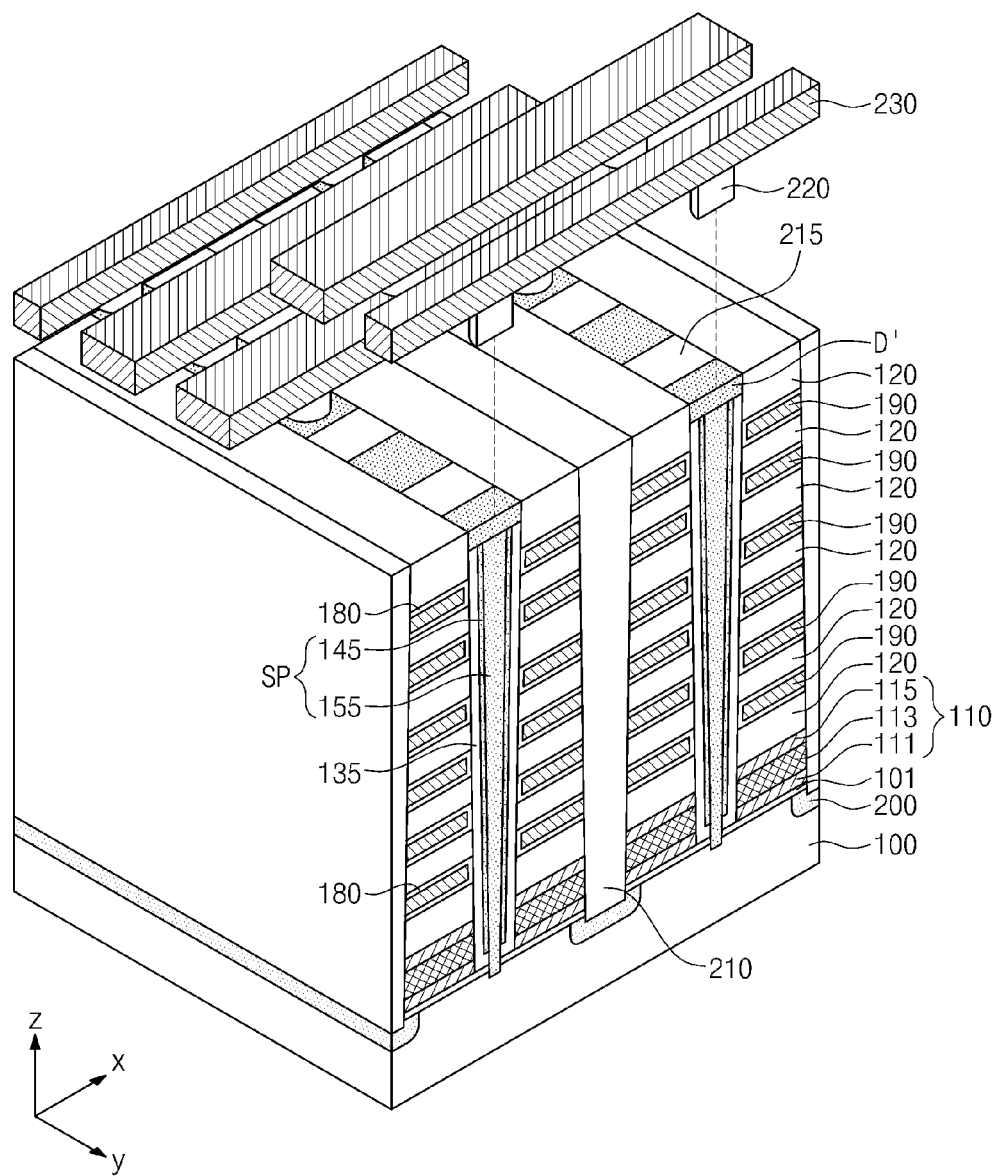
Figure 4:
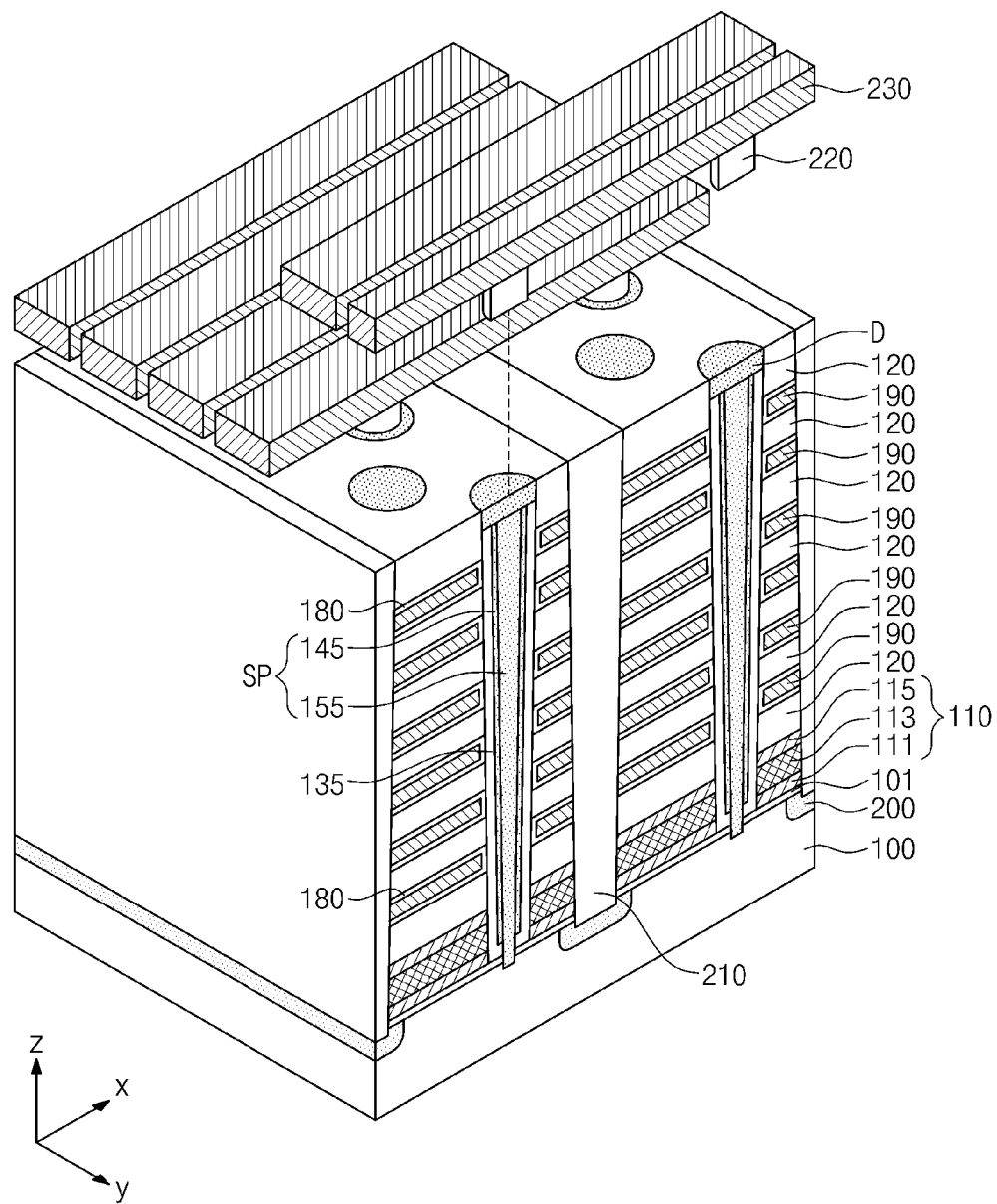

According to example embodiments of inventive concepts, the semiconductor patterns SP may be arranged spaced apart from each other along a running direction of the conductive pattern 190, as shown in FIG. 2. According to example embodiments of inventive concepts, the semiconductor patterns SP may be interposed between a pair of the conductive patterns 190, which are horizontally separated from each other and are shaped like a line, as shown in FIG. 3, and an insulating layer 215 may be interposed between the semiconductor patterns SP arranged along the running direction of the conductive pattern 190. According to example embodiments of inventive concepts, as shown in FIG. 4, the semiconductor patterns SP may be arranged along the running direction of the conductive pattern 190 in a zigzag manner.

Each of the semiconductor patterns SP may include a semiconductor spacer 145 and a semiconductor body portion 155. The semiconductor spacer 145 may be shaped like a cylindrical shell with open ends, and the semiconductor body portion 155 may be shaped like a solid cylinder and fill an inner region of the semiconductor spacer 145, but example embodiments are not limited thereto. Alternatively, the semiconductor body portion 155 may cover an inner wall of the semiconductor spacer 145 and the top surface of the substrate 100. That is, the semiconductor body portion 155 may be shaped like a cup, and in this case, an inner region of the semiconductor body portion 155 may be filled with an insulating material (not shown).

The semiconductor body portion 155 may penetrate the lower insulating layer 101 and be connected to the substrate 100. According to example embodiments of inventive concepts, as illustrated, the semiconductor body portion 155 may be inserted into the substrate 100. In this case, the semiconductor body portion 155 may have a vertical length longer than the semiconductor spacer 145, and a bottom surface of the semiconductor body portion 155 may be located at a level lower than the uppermost surface of the substrate 100. That is, the bottom surface of the semiconductor body portion 155 may be located at a level lower than that of the semiconductor spacer 145. The semiconductor body portion 155 may be in direct contact with the substrate 100 through the bottom surface thereof, while the semiconductor spacer 145 may be spaced apart from the substrate 100. The lower insulating layer 101 may be between the substrate 100 and the semiconductor spacer 145.

Figure 7:
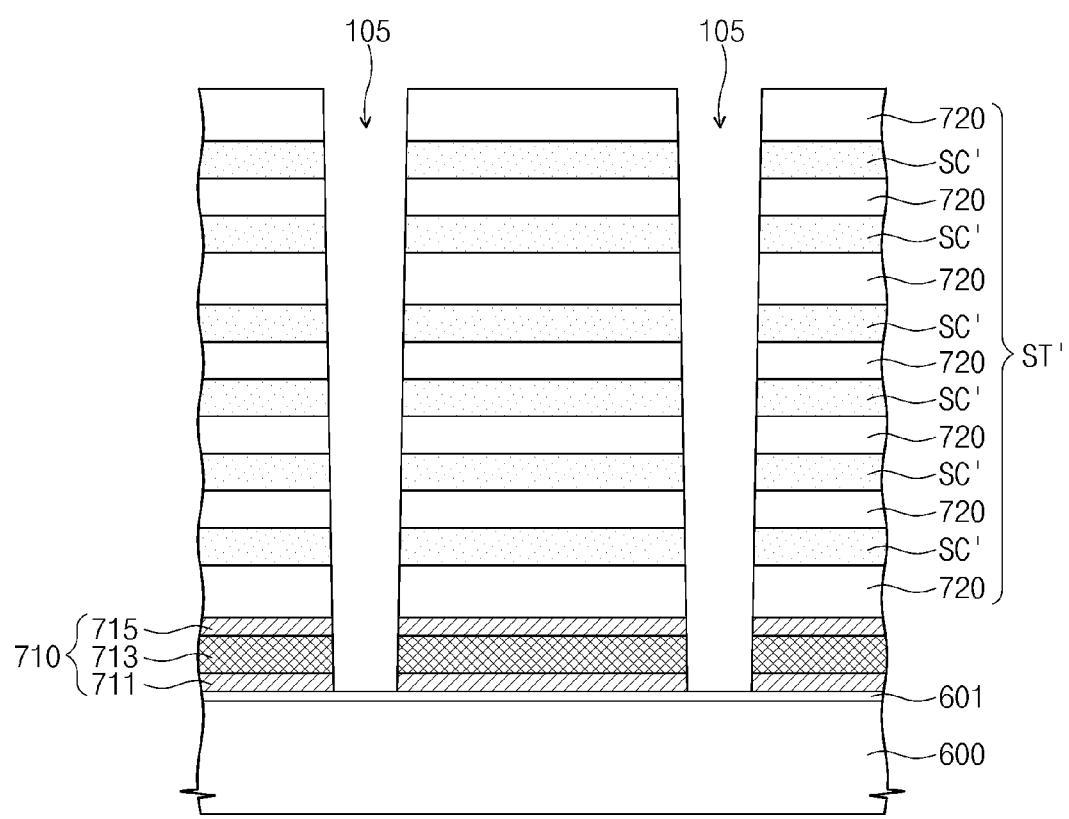

An upper doped region D may be formed on the semiconductor pattern SP and have a different conductivity type from the semiconductor pattern SP. In this case, the upper doped region may form a rectifying element, such as a diode, together with the semiconductor pattern SP disposed thereunder. Referring to FIGS. 2-4, the upper doped region D may have a round shape as shown in FIGS. 2 and 4 or a rectangular shape doped region D' as shown in FIG. 3 according to a shape of the openings 105, as shown in FIG. 7, but example embodiments are not limited thereto.

According to example embodiments of inventive concepts, the semiconductor pattern SP may be formed of a material exhibiting a semiconductor property. For example, the semiconductor spacer 145 and the semiconductor body portion 155 may be one of a polysilicon layer, an organic semiconductor layer, or carbon nano structures, but example embodiments are not limited thereto. The semiconductor body portion 155 and/or the semiconductor spacer 145 may have a different crystal structure than polycrystalline silicon formed through CVD, after undergoing a crystalline structure changing step (e.g., an epitaxial technique including a laser annealing step). For example, the semiconductor body portion 155 and/or the semiconductor spacer 145 may include a bottom portion and a top portion of different grain sizes.

Vertical insulating patterns 135 may be interposed between the electrode structures and the semiconductor patterns SP, respectively. In addition, horizontal insulating patterns 180 may be interposed between the conductive patterns 190 and the semiconductor patterns SP.

Each of the vertical insulating patterns 135 may be shaped like a cylindrical shell with open ends and include a bottom portion extending below the semiconductor spacer 145. According to example embodiments of inventive concepts, the vertical insulating pattern 135 may be in direct contact with the lower insulating layer 101 through a bottom surface thereof. That is, the lower insulating layer 101 may be interposed between the vertical insulating pattern 135 and the substrate 100 to separate the vertical insulating pattern 135 from the substrate 100. Furthermore, the lower insulating layer 101 may be thinner below the vertical insulating pattern 135 than below the lower electrode structure 110. Sidewalls of the lower electrode structure 110 and the conductive patterns 190 may be partially covered with the vertical insulating pattern 135 and an outer sidewall of one of the semiconductor patterns SP may be entirely covered with the vertical insulating pattern 135 as a single body.

The horizontal insulating pattern 180 may extend from a region between the conductive pattern 190 and the semiconductor pattern SP to cover top and bottom surfaces of the conductive pattern 190. That is, the horizontal insulating pattern 180 may have a major axis parallel to the top surface (e.g., the xy plane) of the substrate 100.

The vertical and horizontal insulating patterns 135 and 180 may serve as a memory element of a charge trap type non-volatile memory transistor, each of which may include one or more layers. That is, each of the vertical insulating pattern 135 and the horizontal insulating pattern 180 may consist of one or more layers.

Figure 5D:
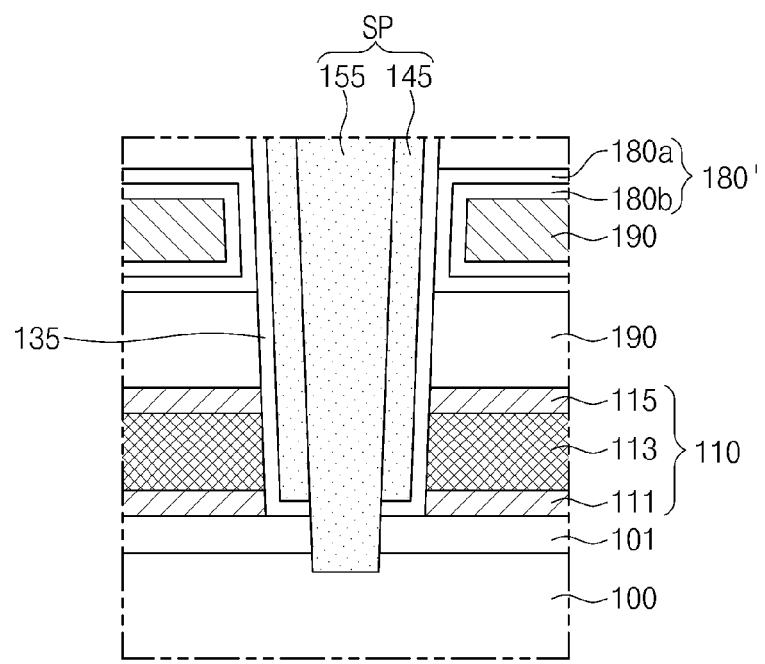

According to example embodiments of inventive concepts, as shown in FIGS. 5A through 5C, the vertical insulating pattern 135 may include two layers 135a and 135b serving as a trap insulating layer and a tunnel insulating layer, and the horizontal insulating pattern 180 may include one layer serving as a blocking insulating layer. According to example embodiments of inventive concepts, as shown in FIG. 5D, the vertical insulating pattern 135 may include one layer serving as the tunnel insulating layer, and the horizontal insulating pattern 180' may include two layers, 180a and 180b, serving as the trap insulating layer and the blocking insulating layer respectively. According to example embodiments of inventive concepts, as shown in FIG. 5E, the vertical insulating pattern 135 may include three layers 135a, 135b and 135c serving as the blocking insulating layer, the trap insulating layer and the tunnel insulating layer and be in direct contact with the conductive patterns 190.

The tunnel insulating layer may be formed to be in direct contact with the semiconductor pattern SP and be formed of a material having a dielectric constant lower than that of the blocking insulating layer. The blocking insulating layer may be formed to be in direct contact with the conductive patterns 190 and be formed of at least one of silicon oxide, silicon nitride, silicon oxynitride, and high-k dielectrics, but example embodiments are not limited thereto. Here, the high-k dielectrics may refer to insulating materials having a dielectric constant higher than that of silicon oxide and may include tantalum oxide, titanium oxide, hafnium oxide, zirconium oxide, aluminum oxide, yttrium oxide, niobium oxide, cesium oxide, indium oxide, iridium oxide, barium-strontium-titanate (BST) materials, lead-zirconium-titanate (PZT) materials, and the like. The trap insulating layer may be interposed between the tunnel insulating layer and the blocking insulating layer and be an insulating layer having rich charge trap sites (e.g., a silicon nitride layer) or an insulating layer having conductive grains. According to example embodiments of inventive concepts, the tunnel insulating layer may be formed of silicon oxide, the trap insulating layer may be formed of silicon nitride, and the blocking insulating layer may be formed of aluminum oxide.

Doped regions 200 may be provided in the substrate 100 between the electrode structures. The doped regions 200 may have a different conductivity type from the substrate 100, and thus, each of the doped regions 200 may form a pn-junction, along with the substrate 100.

According to example embodiments of inventive concepts, the doped regions 200 may be connected to each other and may be in an equipotential state. According to example embodiments of inventive concepts, the doped regions 200 may be at different electric potentials and may be electrically separated from each other. According to example embodiments of inventive concepts, the doped regions 200 may be a plurality of separate source groups including different doped regions and the source groups may be electrically separated from each other to be at different electric potentials.

An electrode separation pattern 210 of insulating material may be formed on the doped region 200 between the electrode structures. According to example embodiments of inventive concepts, a metal pattern (not shown) may be formed through the electrode separation pattern 210 and be connected to the doped region 200.

Upper interconnection lines 230 may be formed to cross over the electrode structures and be connected to the upper doped regions D (or D'), which are disposed on the semiconductor patterns SP, via contact plugs 220.

In three-dimensional semiconductor memory devices according to example embodiments of inventive concepts, each semiconductor pattern SP may serve as a channel region of metal-oxide-semiconductor field effect transistor (MOSFET). The lower electrode structure 110 and the conductive patterns 190 may serve as gate electrodes of the ground and string selection transistors GST and SST and the cell transistors MCT, shown in FIG. 1. According to example embodiments of inventive concepts, if high voltages are applied to the lower electrode structure 110 and the conductive patterns 190, portions of the semiconductor pattern SP adjacent to the lower electrode structure 110 and the conductive patterns 190 may be placed at an inversion state. In addition, for example, other portions of the semiconductor pattern SP between the lower electrode structure 110 and the conductive patterns 190 may also be placed at an inversion state due to fringe fields generated from the lower electrode structure 110 and the conductive patterns 190. Accordingly, inversion regions induced in the semiconductor pattern SP may be vertically overlapped with each other to form an electric current pathway electrically connecting the doped region 200 (e.g., the common source line CSL of FIG. 1) to a selected bit line BL (e.g., of FIG. 1). According to example aspects of inventive concepts, each semiconductor pattern SP may constitute a MOS capacitor in conjunction with the lower electrode structure 110 or each conductive pattern 190.

A method of fabricating a three-dimensional semiconductor memory device according to example embodiments of inventive concepts will now be described with reference to FIGS. 6 through 14.

Figure 6:
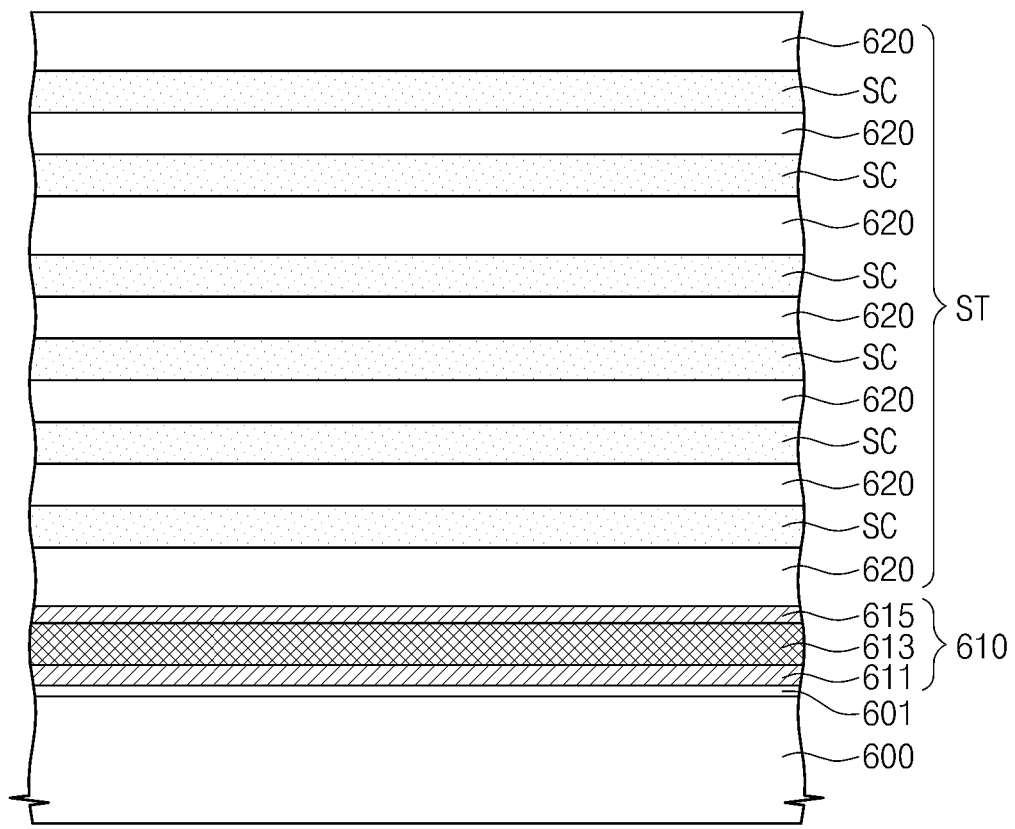

Referring to FIG. 6, a lower conductive structure 610 may be formed on a substrate 600.

The substrate 600 may include at least one material selected from the group consisting of semiconductor, conductive, and insulating materials. For example, the substrate 600 may be a silicon wafer.

The lower conductive structure 610 may include a plurality of layers, as shown in FIGS. 5A and 5B, or a single layer, as shown in FIG. 5C. For instance, the lower conductive structure 610 may include at least one of a doped silicon layer, a metal layer, a metal nitride layer, and/or a metal silicide layer.

The lower conductive structure 610 may be formed by sequentially stacking a first conductive layer 611, a second conductive layer 613, and a third conductive layer 615. The first conductive layer 611, the second conductive layer 613, and the third conductive layer 615 may be formed of one or more conductive materials. For instance, the first and third conductive layers 611 and 615 may include a doped polysilicon layer and the second conductive layer 613 may include at least one of materials having electric resistivity lower than the first and third conductive layers 611 and 6115 (such as, a metal layer and/or a metal silicide layer). Alternatively, the first and third conductive layers 611 and 615 may include a metal nitride layer, such as a titanium nitride layer or a tantalum nitride layer, and the second conductive layer 613 may include a metal layer (e.g., of tungsten). Furthermore, as shown in FIG. 5B, the formation of the lower conductive structure 110 may include sequentially forming a lower polysilicon layer 111, a metal layer 113, and an upper polysilicon layer 115, and performing a thermal treatment process to form metal silicide layers 112 and 114 at interfaces between the lower and upper polysilicon layer 111 and 115 and the metal layer 113.

A lower insulating layer 601 may be formed on the substrate 600 before forming the lower conductive structure 610. The lower insulating layer 601 may be formed of an insulating material, for instance, a silicon oxide layer formed by a thermal oxidation, but example embodiments are not limited thereto. The lower insulating layer 601 may be thinner than an insulating layer 620, which will be subsequently formed on the lower conductive structure 610. For instance, the lower insulating layer 601 may be formed to a thickness ranging from about 10 angstrom to 100 angstrom. By virtue of the lower insulating layer 601, the substrate 600 may be prevented and/or limited from being damaged when an opening 105 is formed through the lower conductive structure 610. In addition, the lower insulating layer 601 may suppress and/or reduce defects from being formed on the surface of the substrate 600 and relieve a stress between the lower conductive structure 610 and the substrate 600.

Subsequently, a mold structure ST may be formed on the lower conductive structure 610. The mold structure ST may include a plurality of insulating layers 620 and a plurality of sacrificial layers SC, which are alternatingly stacked on the lower conductive structure 610, as shown in FIG. 6.

The sacrificial layer SC may be formed of a material having an etch selectivity with respect to the insulating layers 620. For example, the insulating layers 620 may include a material that is etched at a slower rate than a material of the sacrificial layer SC during a subsequent process of etching the sacrificial layer SC. The etch selectivity may be quantitatively expressed as a ratio of an etch rate of a material of the sacrificial layer SC to a material of the insulating layer 620. According to example embodiments of inventive concepts, the sacrificial layer SC may be one or more materials providing an etch selectivity of 1:10 to 1:200 (more particularly, 1:30 to 1:100) with respect to the insulating layer 620. For example, the insulating layer 620 may be formed of at least one of silicon oxide or silicon nitride, and the sacrificial layer SC may be formed of at least one, which is selected to be different from the insulating layer 620, of silicon, silicon oxide, silicon carbide or silicon nitride. Similarly, the insulating layer 620 may be formed of a material having an etch selectivity with respect to the sacrificial layer SC. In the following description, for easier understanding of example embodiments of inventive concepts, example embodiments will be described with respect to the insulating layer 620 of silicon oxide and the sacrificial layer SC of silicon nitride. However, example embodiments of inventive concepts are not limited to silicon oxide and silicon nitride, and each of the insulating layers 620 and the sacrificial layers SC is not limited to a single material.

According to example embodiments of inventive concepts, the sacrificial layers SC may be formed to have the substantially same thickness, as shown. By contrast, at least one of the insulating layers 620 may be formed to have a different thickness from the others. For example, some of the insulating layers 620 may be formed to the substantially same thickness as the sacrificial layers SC, and the others of the insulating layers 620 may be thicker or thinner than the sacrificial layers SC. But the insulating layer 620 may be variously modified to have thicknesses different from those depicted in FIG. 6, and the mold structure ST may be variously modified in terms of the number of layers therein.

Referring to FIG. 7, openings 105 may be formed to expose the lower insulating layer 601 through the mold structure ST and the lower conductive structure 610, thereby forming a mold structure ST' including lower conductive structure 710, first conductive layer 711, second conductive layer 713, third conductive layer 715, and sacrificial layer SC'.

According to example embodiments of inventive concepts, the formation of the openings 105 may include forming a mask pattern (not shown) defining positions of the openings 105 on the mold structure ST1, anisotropically etching the mold structure ST' using the mask pattern as an etch mask to expose the lower conductive structure 610, and anisotropically etching the lower conductive structure 610 using the etched mold structure ST as an etch mask to expose the lower insulating layer 601.

The lower insulating layer 601 may be formed to have a thickness capable of preventing and/or limiting the substrate 600 from being exposed by an over-etching during the anisotropic etching of the lower conductive structure 610 to form lower conductive structure 710.

The sacrificial layers SC', the insulating layers 720 and the lower conductive structure 710 may have sidewalls exposed by the openings 105. A width of each opening 105 may vary according to a distance from the substrate 600, as the result of the anisotropic etching processes. For instance, each opening 105 may be tapered in downward direction.

According to example embodiments of inventive concepts, each of the openings 105 may be shaped like a cylindrical, rectangular, or hexagonal hole, but example embodiments are not limited thereto. And the openings 105 may be two-dimensionally and regularly arranged on a top surface (or xy-plane) of the substrate 600 or 100, as shown in FIGS. 2 through 4. For instance, each opening 105 may be spaced apart from other openings 105 in each of x and y directions orthogonal to one another. According to example embodiments of inventive concepts, each opening 105 may be a trench extending along y direction and having a line shaped section in plan view, and the openings 105 may be formed parallel to each other. In example embodiments, the openings 105 may be arranged along the y-axis in a zigzag manner, as shown in FIG. 4. A distance between the openings 105 disposed adjacent to each other may be less than or equivalent to a width of each opening 105. A density of the openings 105 may be increased due to the zigzagged arrangement of the openings 105.

Figure 8:
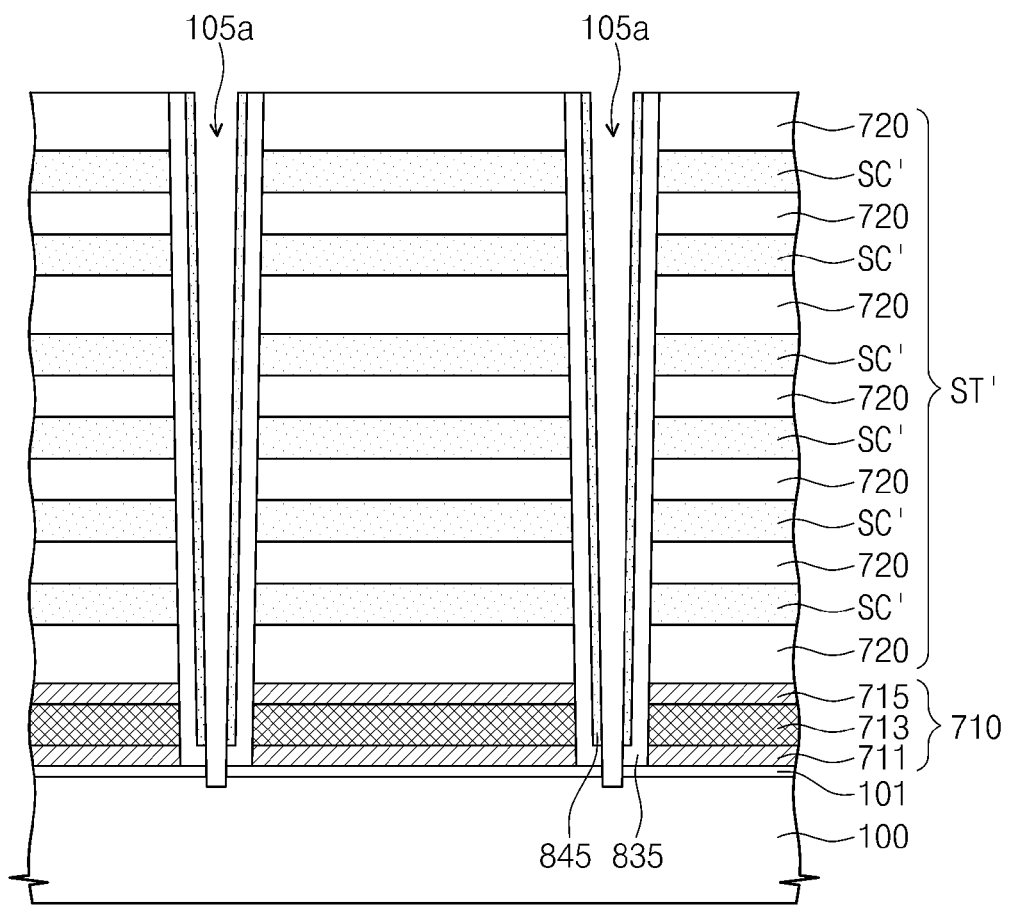

Referring to FIG. 8, vertical insulating patterns 835 and semiconductor spacers 845 may be formed to cover inner walls of the openings 105.

The formation of the vertical insulating patterns 835 and the semiconductor spacers 845 may include forming a vertical insulating layer to conformally cover the mold structure ST provided with the openings 105, forming the semiconductor spacers 845 in the openings 105 respectively, and anisotropically etching the vertical insulating layer and the lower insulating layer 601 using the semiconductor spacers 845 as an etch mask to form the lower insulating layer 101 and substrate 100, for example as shown in FIG. 2.

The vertical insulating layer may include one or more layers. For example, the vertical insulating layer may include at least one of layers serving as a memory element of a charge trap type nonvolatile memory transistor. In the meantime, example embodiments of inventive concepts may be variously classified according to type of layers constituting the vertical insulating layer.

Here, since the lower insulating layer 101 remains at the bottom of the openings 105 and cover the top surface of the substrate 100, the anisotropically etched vertical insulating layer may also be spaced apart from the substrate 100 due to the presence of the lower insulating layer 101. According to example embodiments of inventive concepts, the total deposition thickness of the vertical insulating layer and the first semiconductor layer may be less than half a width of the opening 105, and thus, the opening 105 may be only partially filled with the vertical insulating layer and the first semiconductor layer.

The formation of the semiconductor spacers 145 may include forming a first semiconductor layer on the mold structure ST to conformally cover inner walls of the openings 105 provided with the vertical insulating layer and then anisotropically etching the first semiconductor layer. As a result, the semiconductor spacers 145 may be formed to expose the vertical insulating layer at a bottom of the opening 105.

According to example embodiments of inventive concepts, the first semiconductor layer may be a polysilicon layer formed by one of an atomic layer deposition (ALD) or a chemical vapor deposition (CVD) and may have a thickness ranged from $\frac{1}{50}$ to $\frac{1}{5}$ of a width of the opening 105. According to example embodiments of inventive concepts, the first semiconductor layer may be formed using one of epitaxial techniques. According to example embodiments, the first semiconductor layer may be one of amorphous silicon layer, a single-crystalline silicon layer, an organic semiconductor layer, or carbon nano structures.

As the result of the anisotropic etching of the first semiconductor layer, the semiconductor spacer 845 may have a cylindrical shell with open ends. As described above, the semiconductor spacer 845 may be used as a mask pattern during the anisotropic etching of the vertical insulating layer and may prevent the vertical insulating layer from being damaged during the process for exposing the substrate 100.

Through holes 105a may be formed in the opening 105, as the result of the anisotropically etching of the vertical insulating layer and the lower insulating layer 101. The through holes 105a may be formed to expose the substrate 100. Accordingly, as shown in FIG. 8, the vertical insulating layer may form vertical insulating patterns 835, each of which is formed like a cylindrical shell with open ends and is disposed on the lower insulating layer 101. According to example embodiments of inventive concepts, the substrate 100 may be recessed due to over-etching of the vertical insulating layer and the lower insulating layer 101. Here, a planar boundary of the recess of the substrate 100 may be defined by an inner wall of the semiconductor spacer 845.

Since the semiconductor spacer 845 is used as the etch mask during the anisotropic etching of the vertical insulating layer, a portion of the vertical insulating layer located below the semiconductor spacer 845 may not be etched. As a result, the vertical insulating pattern 835 may have a bottom portion interposed between a bottom surface of the semiconductor spacer 845 and a top surface of the substrate 100.

A top surface of the mold structure ST' may be exposed by the anisotropic etching of the first semiconductor layer and the vertical insulating layer. This means that each of the vertical insulating patterns 835 and each of the semiconductor spacers 845 may be localized in the corresponding one of the openings 105. That is, the vertical insulating patterns 835 and the semiconductor spacers 845 may be two-dimensionally arranged on the top surface (i.e., the xy plane) of the substrate 100.

Figure 9:
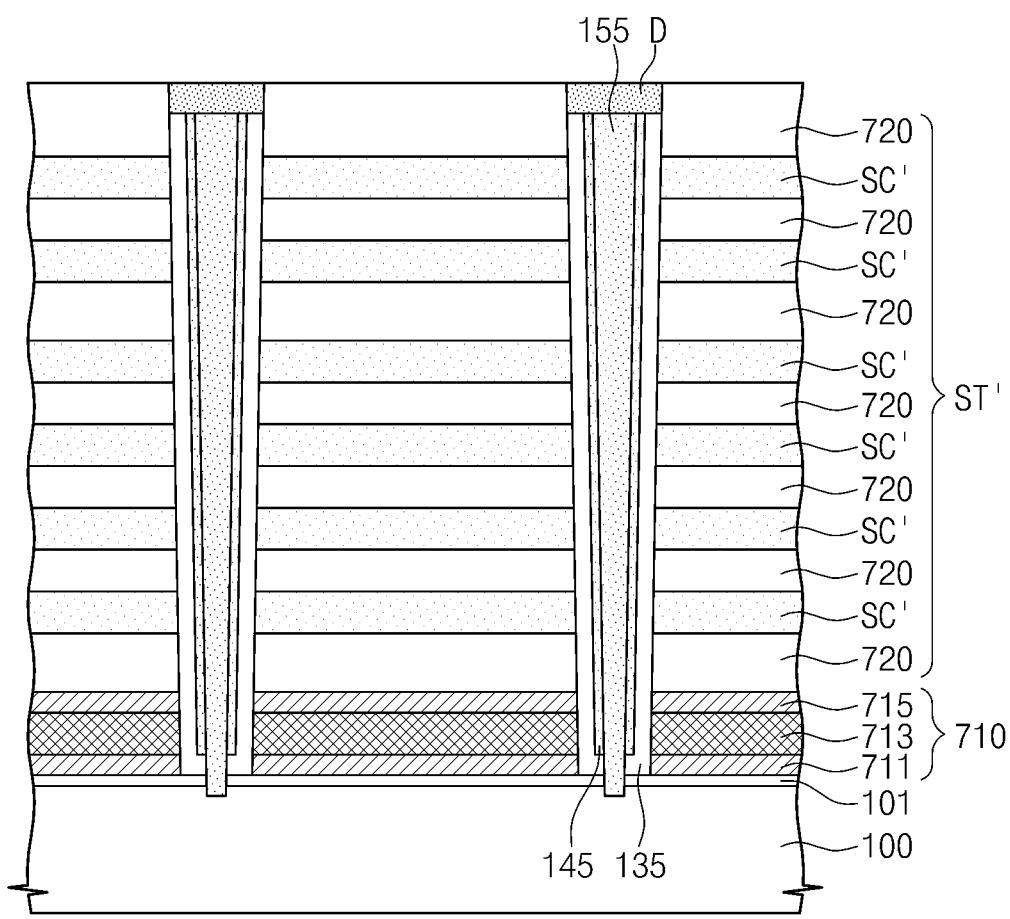

Referring to FIG. 9, a top portion of semiconductor spacer 845 and vertical insulating patterns 835 may be removed to form vertical insulating patterns 135 and semiconductor spacers 145. Semiconductor body portions 155 may be formed in the openings 105, respectively, provided with the vertical insulating patterns 135 and the semiconductor spacers 145. The semiconductor body portion 155 and the semiconductor spacer 145 may constitute a semiconductor pattern SP.

According to example embodiments of inventive concepts, the formation of the semiconductor body portions 155 may include filling the openings 105 with a second semiconductor layer, and planarizing the second semiconductor layer to form the semiconductor body portions 155 in the openings 105. In this case, each of the semiconductor body portions 155 may be shaped like a solid cylinder, but example embodiments are not limited thereto and the shape of semiconductor body portions may vary according to a shape of the openings 105 and through holes 105a.

According to example embodiments of inventive concepts, the formation of the semiconductor body portions 155 may include sequentially forming a second semiconductor layer and an insulating gap-filling layer in the openings 105. The second semiconductor layer may be conformally formed to a thickness that does not completely fill the openings 105. As a result, the semiconductor body portion 155 may be formed to have a pipe shape, a hollow cylindrical shape, or a cup shape, but example embodiments are not limited thereto. The insulating gap-filling layer may be formed to fill an empty space of the opening 105 defined by the semiconductor body portion 155.

According to example embodiments of inventive concepts, at least one of the semiconductor spacer 145 and the semiconductor body portion 155 may be a polysilicon layer formed using one of a chemical vapor deposition (CVD) process or an atomic layer deposition (ALD) process, but example embodiments are not limited thereto. A hydrogen annealing step may be further performed to for thermally treat the structure including the semiconductor body portion 155 under a gas atmosphere including hydrogen and/or heavy hydrogen. Crystal defects in the semiconductor spacer 145 and the semiconductor body portion 155 may be cured and/or reduced during the hydrogen annealing.

According to example embodiments of inventive concepts, the semiconductor spacer 145 and the semiconductor body portion 155 may include a layer of, for instance, silicon (Si), germanium (Ge), or any combination thereof. The semiconductor spacer 145 and the semiconductor body portion 155 may be a doped semiconductor layer or an intrinsic semiconductor layer. The semiconductor spacer 145 and the semiconductor body portion 155 may be formed to have one of a single-crystalline structure, an amorphous structure, or a polycrystalline structure.

According to example embodiments of inventive concepts, the semiconductor spacer 145 and the semiconductor body portion 155 may be formed in the respective openings by a chemical vapor deposition (CVD) process or an atomic layer deposition (ALD) process. In the case that the semiconductor body portion 155 is formed using a deposition process, a discontinuous interface (e.g., an interface dislocation) may be formed between the semiconductor body portion 155 and the substrate 100 due to a difference in crystal structure therebetween. The semiconductor body portion 155 may include at least a single-crystalline structure obtained from a phase transition of an amorphous or polycrystalline silicon layer. The phase transition may be realized by a thermal treatment such as a laser annealing process. The semiconductor body portion 155 may be formed in the respective openings by an epitaxial process using the substrate 100 exposed by the openings 105 as a seed layer.

After the formation of the semiconductor body portion 155, upper doped regions D may be formed in upper portions of the semiconductor spacers 145 and the semiconductor body portions 155. The upper doped region D may be doped with impurities having a different conductivity type from the remaining portion of the semiconductor spacer 145 and the semiconductor body portions 155, and thus, the upper doped region D and the remaining portion of the semiconductor spacer 145 and the semiconductor body portions 155 may constitute a rectifying device, such as a diode. While FIGS. 9-14 illustrate round doped regions D, example embodiments are not limited thereto and other shapes of doped regions, such as the rectangular doped regions D' of FIG. 3 may be substituted according to a shape of the openings 105.

Figure 10:
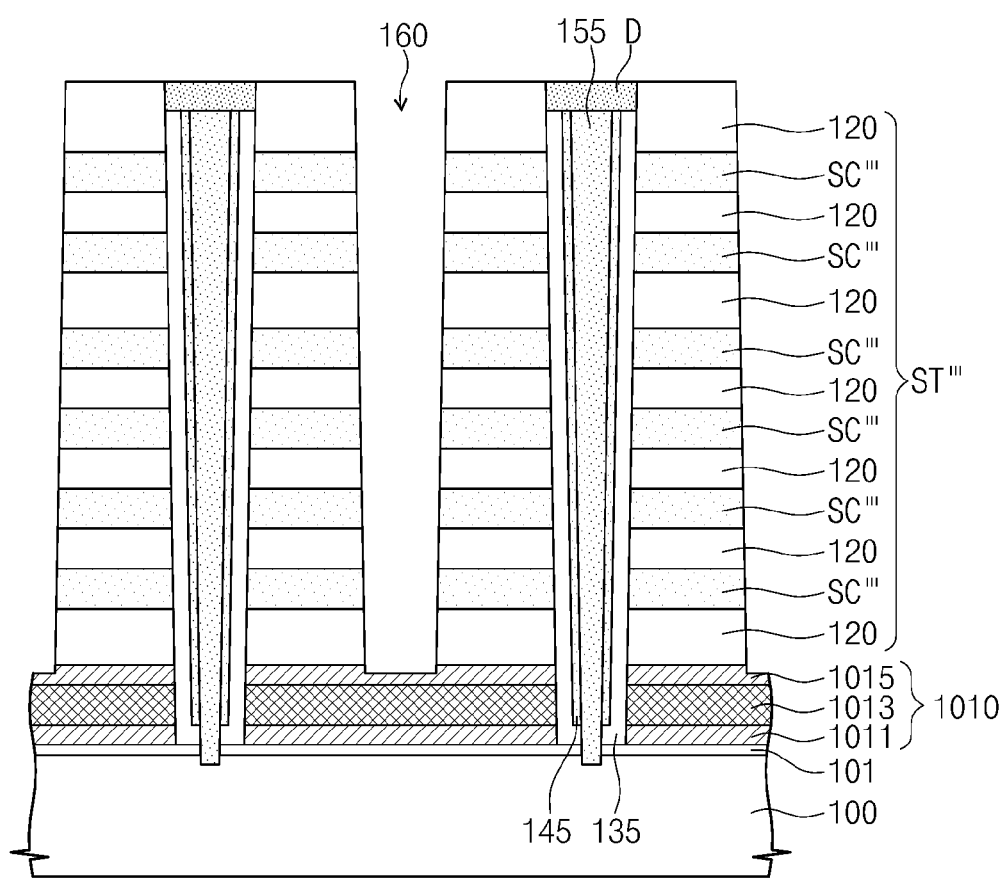

Referring to FIG. 10, trenches 160 may be formed through the mold structure ST to expose the lower conductive structure 110 the semiconductor body portions 155, thereby forming a mold structure ST''' including lower conductive structure 1010, first conductive layer 1011, second conductive layer 1013, third conductive layer 1015, and sacrificial layer SC'''.

The formation of the trenches 160 may include forming a mask pattern (not shown) defining positions of the trenches 160 on the mold structure ST, and anisotropically etching the mold structure ST using the mask pattern as an etch mask.

The trenches 160 may be formed spaced apart from the semiconductor body portions 155 and expose the sidewalls of the sacrificial layers SC and insulating layers 120. The trench 160 may be shaped like a line or a rectangle in plan view, and the trench 160 may be formed to expose the top surface of the lower conductive structure 110 in vertical sectional view. A width of the trench 160 may vary according to a distance from the substrate 100, as the result of the anisotropic etching process. For instance, each trench 160 may be tapered in a downward direction.

The lower conductive structure 110 may serve as an etch stop layer in the formation of the trenches 160, and may be recesses due to over-etching during the formation of the trenches 160.

Due to the presence of the trenches 160, the mold structure ST may have a line shape extending along y-axis. The line-shaped mold structure ST may be penetrated by a plurality of the semiconductor body portions 155 arranged along y direction and include the sacrificial layers SC and the insulating layers 120 alternatingly stacked on the substrate 100. The mold structure ST may have inner sidewalls adjacent to the semiconductor body portions 155 and an outer sidewall delimited by the trench 160.

Figure 11:
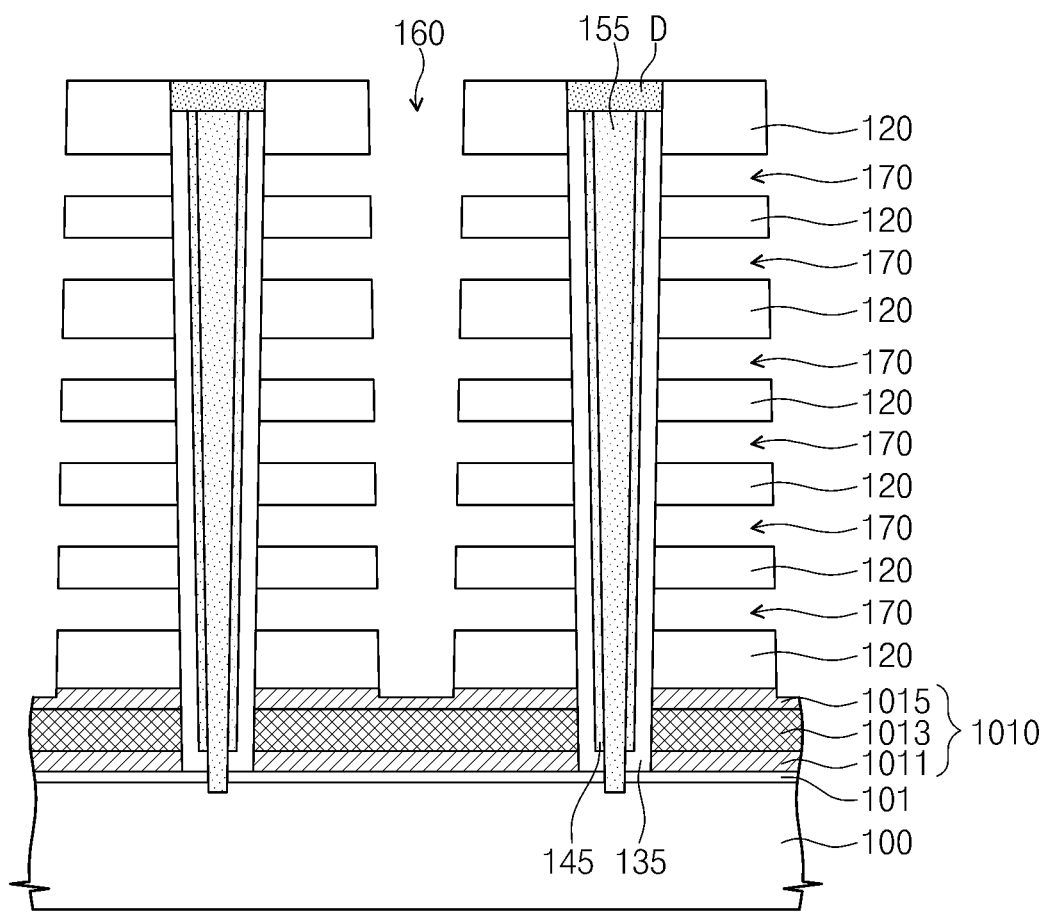

Referring to FIG. 11, recess regions 170 may be formed between the insulating layers 120 by selectively removing the sacrificial layers SC" exposed by the trenches 160.

The recess regions 170 may be gap regions extending laterally from the trenches 160, and may be formed to partially expose the sidewalls of the semiconductor spacers 145. A vertical thickness of the recess region 170 may be determined by a deposition thickness of the corresponding sacrificial layer SC".

The formation of the recess regions 170 may include isotropically etching the sacrificial layers SC" exposed by the trenches 160 using an etch recipe having an etch selectivity with respect to the insulating layers 120. The sacrificial layers SC" may be fully removed by the isotropic etching process. In the case in which the sacrificial layers SC" are formed of silicon nitride and the insulating layers 120 are formed of silicon oxide, the removal of the sacrificial layers SC may be performed with an etching solution containing phosphoric acid.

Figure 12:
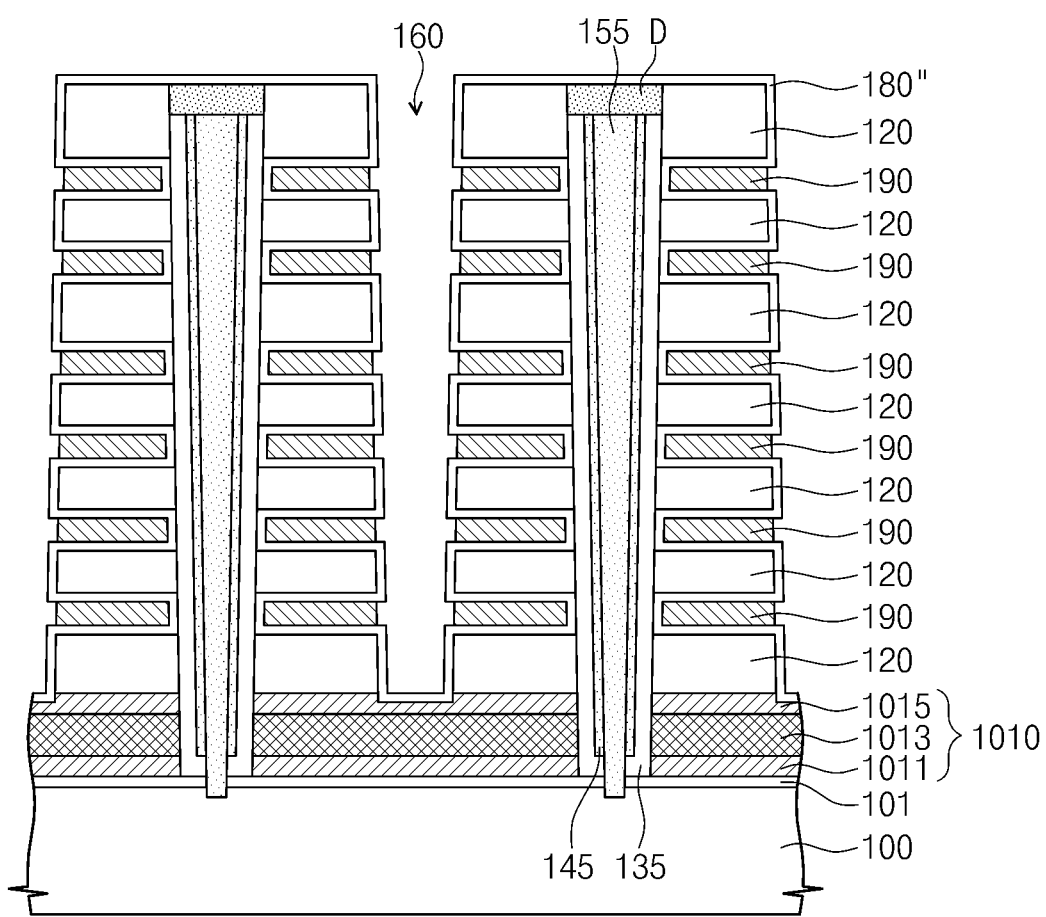

Referring to FIG. 12, horizontal insulating patterns 180" and conductive patterns 190 may be sequentially formed in the recess regions 170. The horizontal insulating pattern 180 may be formed to conformally cover inner walls of the recess regions 170, and the conductive pattern 190 may be formed to fill the remaining space of the recesses 170.

The formation of the horizontal insulating patterns 180" and the conductive patterns 190 may include sequentially forming a horizontal insulating layer and a conductive layer to fill the recess regions 170, and then removing part of the conductive layer from the trenches 200 such that part of the conductive layer remains as the conductive patterns 190 in the recess regions 170.

Similar to the vertical insulating layer, the horizontal insulating layer or the horizontal insulating patterns 180" may include one or more insulating layers. According to example embodiments of inventive concepts, the horizontal insulating pattern 180' may be formed to include a blocking insulating layer constituting a memory element of charge trap type nonvolatile memory transistor. In the meantime, example embodiments of the inventive concepts may be variously classified according to type of layers constituting the vertical insulating layer and the horizontal insulating pattern 180".

The conductive layer may be formed to fill the recess regions 170 covered with the horizontal insulating layer. The trenches 200 may be fully or partially filled with the conductive layer. The conductive layer may include at least one of a doped silicon layer, a metal layer, a metal nitride layer and a metal silicide layer. For example, the conductive layer may include a layer of tantalum nitride or tungsten.

According to example embodiments of inventive concepts, the conductive layer may be formed using a deposition technique providing, for example, excellent and/or improved step coverage property (e.g., a CVD and/or ALD technique). In this case, the conductive layer may be formed to fill the recess regions 170 and conformally cover the trench 160. For instance, the conductive layer may be formed to a thickness greater than half a vertical thickness of the recess region 170. If a horizontal width of the trench 160 is greater than the vertical thickness of the recess region 170, the conductive layer may fill a portion of the trench 160 and define an upward open empty region at a central portion of the trench 160. The conductive patterns 190 may be formed by removing part of the conductive layer from the trench 160 in an isotropic etching manner. According to example embodiments of inventive concepts, the conductive layer may be formed to fill the trench 160, and in this case, the conductive pattern 190 may be formed by anisotropically etching the conductive layer.

Figure 13:
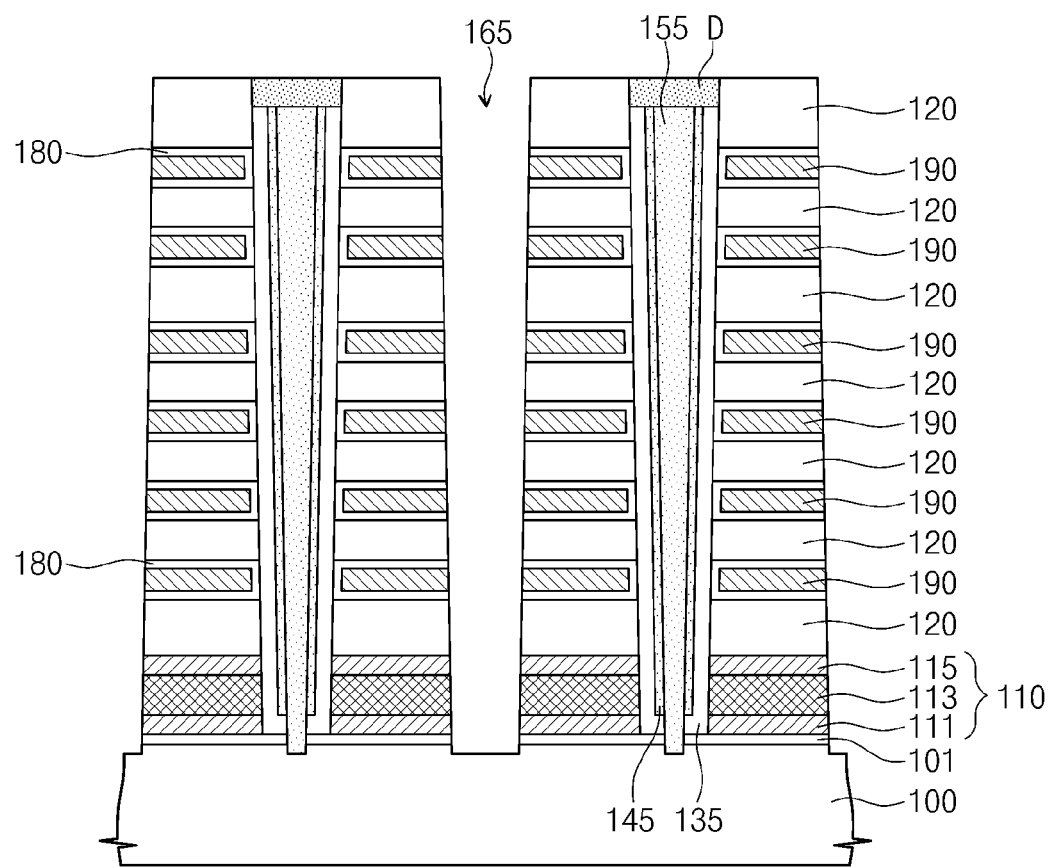

Referring to FIG. 13, the lower conductive structure 110 may be patterned to vertically extend the trench 160. The resulting trenches 165 may be formed to expose the substrate 100.

The formation of the extended trench 165 may be formed selectively removing the horizontal insulating layer 180" on the lower conductive structure 110, anisotropically etching the lower conductive structure 110, and anisotropically etching the lower insulating layer 101. As the result of the formation of the extended trench 165, the lower conductive structure 110 may have a line shape, like the conductive patterns 190.

During the selective removal of the horizontal insulating layer 180"', the horizontal insulating layer 180" may be selectively removed from the sidewalls of the insulating layers 120 to form horizontal insulating layer 180. The selective removal of the horizontal insulating layer 180" may be performed using an etching gas or solution having an etch selectivity with respect to the conductive pattern 190. For instance, the horizontal insulating layer 180" may be isotropically removed using an etching solution containing at least one of HF, $O_3$/HF, phosphoric acid, sulfuric acid, and LAL. Alternatively, the selective removal of the horizontal insulating layer 180" may be performed by sequentially supplying an etching solution containing fluoride and an etching solution containing a phosphoric acid or a sulfuric acid.

The substrate 100 exposed by the extended trenches 165 may be recessed due to over-etching of the lower insulating layer 101.

Figure 14:
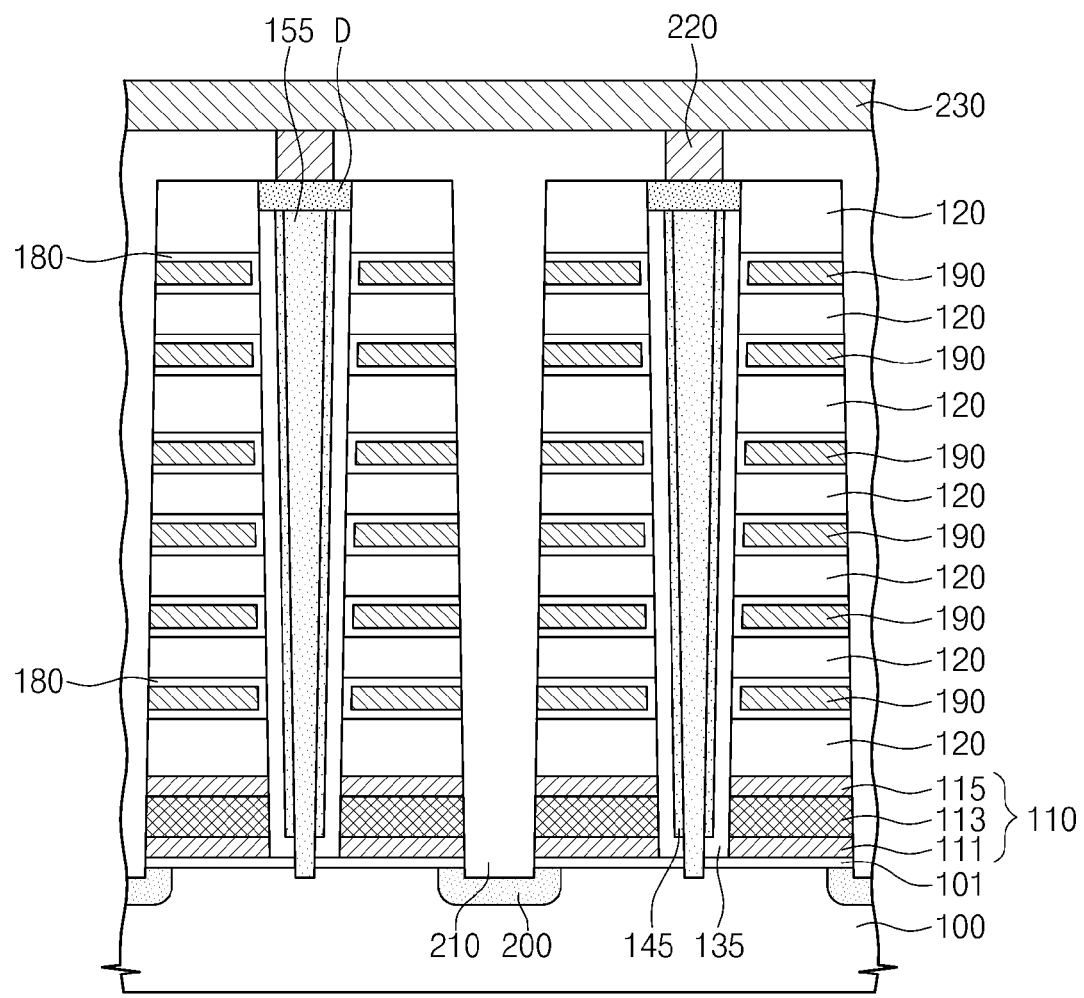

After the formation of the extended trenches 165, as shown in FIG. 14, doped regions 200 may be formed by injecting impurities into the substrate 100 exposed by the extended trenches 165. The doped regions 200 may serve as a common source line of a NAND FLASH memory device.

The doped regions 200 may be formed by an ion implantation process using the electrode structures on the substrate 100 as an ion mask. As a result, each of the doped regions 200 may be shaped like a line extending parallel to the extended trench. According to example embodiments of inventive concepts, the doped region 200 may be laterally diffused and be horizontally overlapped with the electrode structure. The doped regions 200 may have a different conductivity type from the substrate 100.

Referring to FIG. 14, electrode separation patterns 210 may be formed to fill the extended trenches 200.

The formation of the electrode separation patterns 210 may include forming an electrode separation layer on the resultant structure provided with the doped regions 200, and planarizing the electrode separation layer to expose the uppermost layer of the insulating layers 120. The electrode separation layer may be formed of at least one of silicon oxide, silicon nitride or silicon oxynitride, and the planarizing may be performed using a chemical mechanical polishing technique or an etch-back technique.

Subsequently, upper plugs 220 may be formed on the electrode structures, respectively, and upper interconnection lines 230 may be formed on the upper plugs 220 to connect the upper plugs 220 with each other.

According to example embodiments of inventive concepts, the upper plugs 220 may be formed of at least one of doped silicon or metallic materials, but example embodiments are not limited thereto. For instance, the upper plugs 220 may include a doped silicon layer having a different conductivity type from the semiconductor spacer 145 and the semiconductor body portion 155. In this case, the upper plugs 220 may constitute a pn junction along with the semiconductor spacer 145 and/or the semiconductor body portion 155.

Each of the upper interconnection lines 230 may be electrically connected to the semiconductor spacer 145 and the semiconductor body portion 155 via the upper plug 220 and be formed to cross the conductive patterns 190. In example embodiments as applied to the fabrication of a flash memory, the upper interconnection lines 230 may be bit lines connected to upper end portions of a plurality of cell strings.

Figure 15:
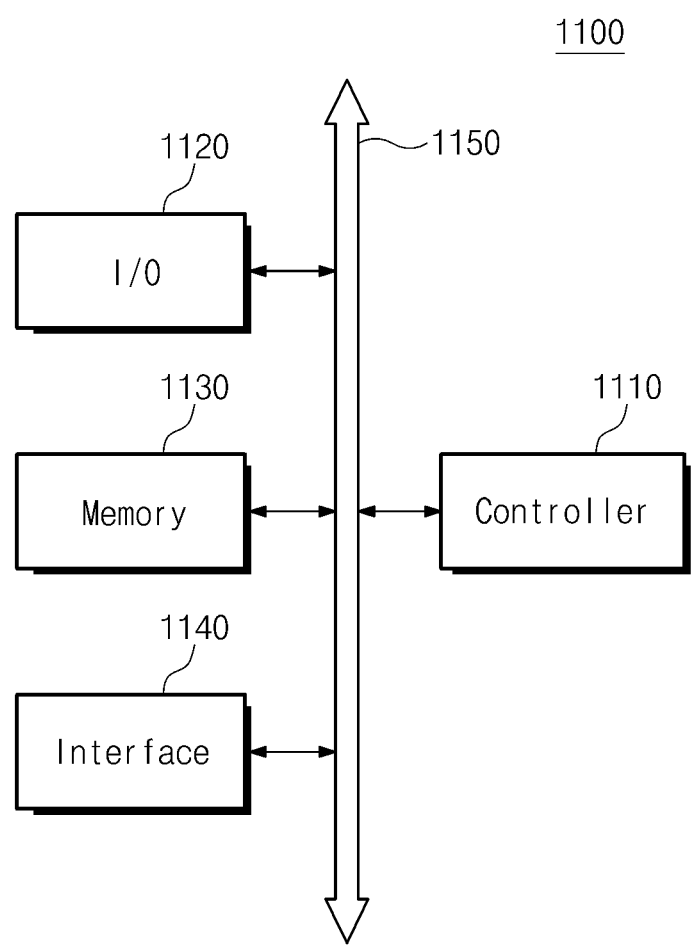

FIG. 15 is a block diagram exemplarily illustrating a memory system including a three-dimensional semiconductor memory device according to example embodiments of inventive concepts.

Referring to FIG. 15, a memory system 1100 can be applied to a personal digital assistant (PDA), a portable computer, a web tablet, a wireless phone, a mobile phone, a digital music player, a memory card and/or all the devices that can transmit and/or receive data in a wireless communication environment.

The memory system 1100 includes a controller 1110, an input/output device 1120 such as a keypad and a display device, a memory 1130, an interface 1140 and a bus 1150. The memory 1130 and the interface 1140 communicate with each other through the bus 1150.

The controller 1110 includes at least one microprocessor, at least one digital signal processor, at least one micro controller or other process devices similar to the microprocessor, the digital signal processor and the micro controller. The memory 1130 may be used to store an instruction executed by the controller 1110. The input/output device 1120 can receive data or a signal from the outside of the system 1100 or transmit data or a signal to the outside of the system 1100. For example, the input/output device 1120 may include a keyboard, a keypad and/or a displayer.

The memory 1130 includes the nonvolatile memory device according to example embodiments of inventive concepts. The memory 1130 may further include a different kind of memory, a volatile memory device capable of random access and various kinds of memories.

The interface 1140 transmits data to a communication network or receives data from a communication network.

Figure 16:
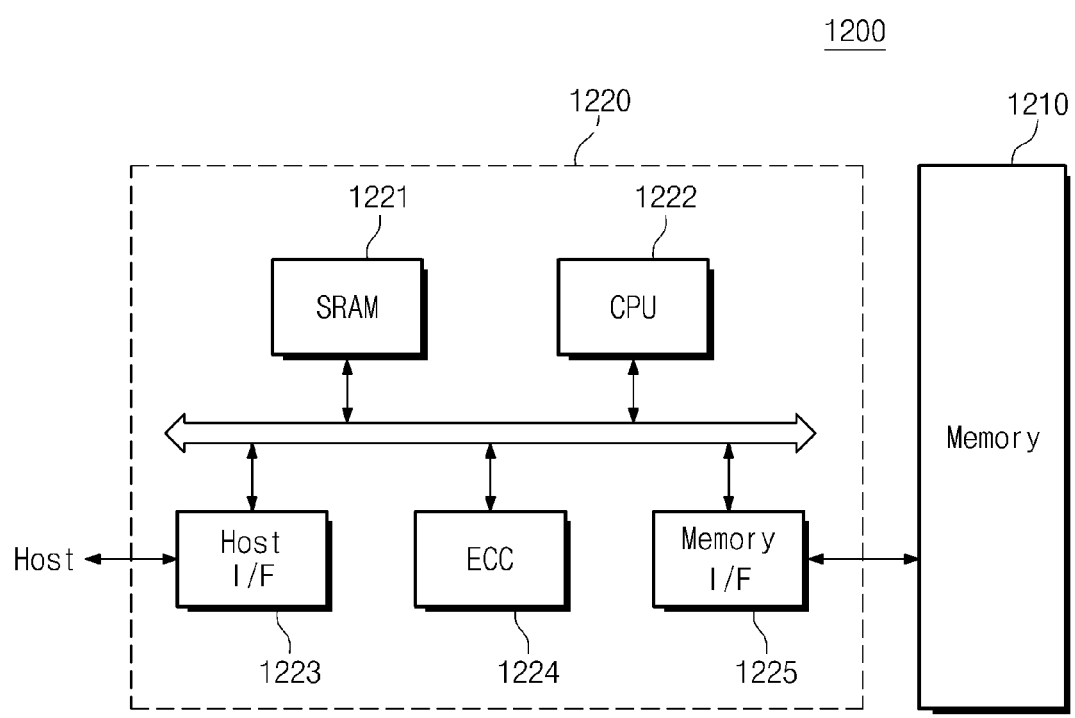

FIG. 16 is a block diagram exemplarily illustrating a memory card including a three-dimensional semiconductor memory device according to example embodiments of inventive concepts.

Referring to FIG. 16, the memory card 1200 for supporting a storage capability of a large capacity is fitted with a semiconductor memory device 1210 according to example embodiments of inventive concepts. The semiconductor memory device 1210 may be a flash memory device, but example embodiments are not limited thereto. The memory card 1200 according to example embodiments of inventive concepts includes a memory controller 1220 controlling every data exchange between a host and the semiconductor memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit semiconductor memory device 1210. A memory interface 1225 interfaces with a semiconductor memory device 1210 according to example embodiments of inventive concepts. The processing unit 1222 performs every control operation for exchanging data of the memory controller 1220. Even though not depicted in drawings, it is apparent to one of ordinary skill in the art that the memory card 1200 according to example embodiments of inventive concepts can further include a ROM (not shown) storing code data for interfacing with the host.

Figure 17:
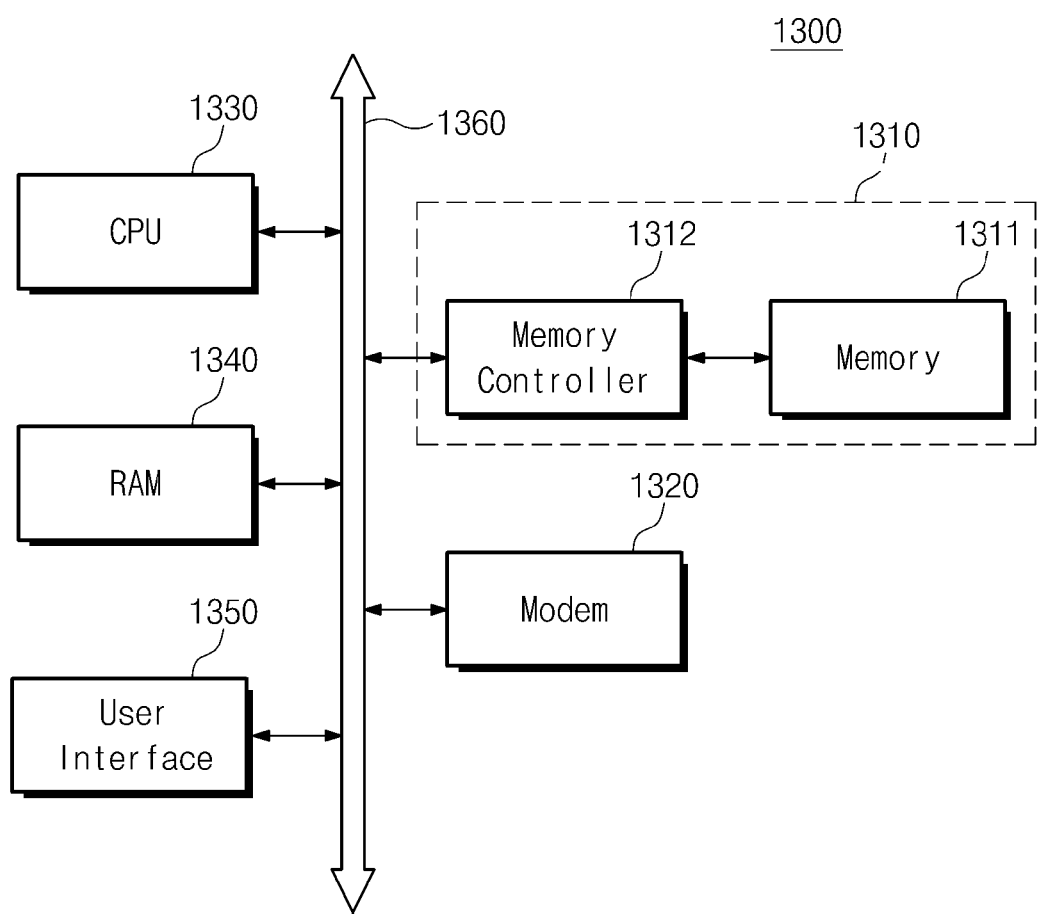

FIG. 17 is a block diagram exemplarily illustrating an information processing system including a three-dimensional semiconductor memory device according to example embodiments of inventive concepts.

Referring to FIG. 17, an information processing system 1300 includes a 3D semiconductor memory system 1310 including a 3D semiconductor memory device, according to example embodiments of inventive concepts. The semiconductor memory system 1310 may be mounted to an information processing system such as a mobile device or a desktop computer. The information processing system 1300 of this example also includes a modem 1320, a central processing unit (CPU) 1330, a RAM 1340, and a user interface 1350, electrically connected to a system bus 1360. The semiconductor memory system 1310 may be configured similarly to that described with respect to FIG. 16, i.e., may have a 3D semiconductor memory device 1311, according to example embodiments of inventive concepts, and a memory controller 1312. Thus, the memory system 1310 may be a solid state drive SSD, and data processed by the CPU 1330 and/or input from the outside may be stored in the SSD. The 3D semiconductor memory device 1311 may be a flash memory device, but example embodiments are not limited thereto.

The information processing system 1300, configured as described above so as to include a 3D semiconductor memory device according to the inventive concept, may reliably store a large amount of data in the semiconductor memory system 1310. Accordingly, the semiconductor memory system 1310 may conserve resources for error correction, and a high speed data exchange function may be provided. Although not shown in the drawing, it will be apparent to those of ordinary skill in the art that the information processing system 1300 may also include an application chipset, a camera image processor (CIS), and/or an input/output device.

Furthermore, a semiconductor memory device according to example embodiments of inventive concepts or memory system comprising the same may be packaged in various kinds of ways. For instance, the semiconductor memory device or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-level Processed Stack Package (WSP), but example embodiments are not limited thereto.

The package in which a semiconductor memory device according to example embodiments of inventive concepts is mounted may further include at least one semiconductor device (e.g., a controller and/or a logic device) that controls the semiconductor memory device.

According to example embodiments of inventive concepts, an electrode structure may include a plurality of electrodes sequentially stacked on a substrate, and a vertical insulating pattern may penetrate the electrode structure but be not inserted into the substrate. That is, the vertical insulating pattern may be spaced apart from the substrate. As a result, it is possible to prevent and/or limit a detour of a current path, which may occur when the vertical insulating pattern is inserted into the substrate. This enables to prevent and/or limit an electric current passing through a cell string from being reduced during an operation of a three-dimensional semiconductor memory device.

While example embodiments of inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
    an electrode structure on a substrate, the electrode structure including a plurality of insulating patterns and conductive patterns alternately stacked on a lower electrode;
    a semiconductor pattern extending through the electrode structure to the substrate;
    a vertical insulating layer between the semiconductor pattern and the electrode structure; and
    a lower insulating layer between the lower electrode and the substrate,
    the lower insulating layer being between a bottom surface of the vertical insulating layer and a top surface of the substrate,
    wherein the vertical insulating layer vertically extends from between the semiconductor pattern and the conductive patterns to between the semiconductor pattern and the insulating patterns.

2. The device of claim 1, further comprising:
    a horizontal insulating layer between the vertical insulating layer and one of the conductive patterns,
    the horizontal insulating layer covering a top and a bottom surface of the one of the conductive patterns.

3. The device of claim 1, wherein
    the lower electrode includes a plurality of conductive layers stacked in a vertical direction.

4. The device of claim 1, wherein
    a vertical thickness of the lower electrode is greater than a vertical thickness of at least one of the conductive patterns.

5. The device of claim 1, wherein the lower electrode comprises:
    a first conductive layer;
    a second conductive layer on the first conductive layer; and
    a third conductive layer on the second conductive layer,
    the second conductive layer including a conductive material having an electric resistivity smaller than an electric resistivity of the first and third conductive layers.

6. The device of claim 1, wherein
    the lower electrode includes a layer containing at least one of doped silicon, metallic materials, metal nitrides, and metal silicides.

7. The device of claim 1, wherein
    a thickness of the lower insulating layer is smaller below the vertical insulating layer than a thickness of the lower insulating layer below the lower electrode.

8. The device of claim 1, wherein the semiconductor pattern comprises:
    a spacer portion inserted into the vertical insulating layer; and
    a body portion inserted into the spacer portion and being in direct contact with the substrate,
    wherein a bottom surface of the body portion is located at a vertical level lower than a bottom surface of the spacer portion.

9. The device of claim 8, wherein
    a bottom portion of the vertical insulating layer is between the lower insulating layer and the spacer portion; and
    a vertical portion of the vertical insulating layer is in contact with a sidewall of the spacer portion.

10. The device of claim 8, wherein
    the bottom surface of the body portion is in direct contact with the substrate; and
    the bottom surface of the spacer portion is spaced apart from the substrate.

11. The device of claim 8, wherein
    the bottom surface of the body portion is located at a vertical level lower than an uppermost surface of the substrate.

12. A three-dimensional semiconductor memory device comprising:
    a lower insulating pattern on a substrate;
    a plurality of cell strings extending vertically between the substrate and a bit line, each of the cell strings including,
        a semiconductor body extending vertically between the substrate and the bit line,
        a vertical insulating layer on the lower insulating pattern,
            the vertical insulating layer surrounding the semiconductor body, and
        a plurality of insulator elements and gate electrodes alternately stacked on the lower insulating pattern, wherein
    each of the plurality of cell strings include a lower electrode structure between the lower insulating pattern and the plurality of insulator elements and gate electrodes alternately stacked, and
    a thickness of the lower insulating pattern is smaller below the vertical insulating layer than a thickness of the lower insulating pattern below the lower electrode structure.

13. The three-dimensional semiconductor memory device of claim 12, wherein
    the lower electrode structure forms a ground selection transistor with a portion of the semiconductor body and a portion of the vertical insulating layer.

14. The three-dimensional semiconductor memory device of claim 12, wherein each of the plurality of cell strings includes
    a horizontal insulating pattern including a plurality of horizontal insulating elements, and
    each horizontal insulating element covers at least two surfaces of the gate electrodes.

15. The three-dimensional semiconductor memory device of claim 12, wherein each of the plurality of cell strings includes:
    a semiconductor spacer between the semiconductor body and the vertical insulating layer.

16. A system comprising:
    a memory controller operably connected to the three-dimensional semiconductor memory device of claim 12.

17. The device of claim 2, wherein
    the horizontal insulating layer includes a plurality of horizontal layers separated from each other, and each one of the horizontal layers covers a top and a bottom surface of a corresponding one of the plurality of conductive patterns and extends between a side surface of the corresponding one of the plurality of conductive patterns and the vertical insulating layer.

18. A three-dimensional semiconductor memory device, comprising:
    an electrode structure on a substrate, the electrode structure including at least one conductive pattern on a lower electrode;
    a semiconductor pattern extending through the electrode structure to the substrate;
    a vertical insulating layer between the semiconductor pattern and the electrode structure;
    a lower insulating layer between the lower electrode and the substrate,
    the lower insulating layer being between a bottom surface of the vertical insulating layer and a top surface of the substrate,
    wherein the device includes at least one of,
    the lower electrode as a multi-layer structure that includes a first conductive layer, a second conductive layer on the first conductive layer, and a third conductive layer on the second conductive layer, the second conductive layer including a conductive material having an electric resistivity smaller than an electric resistivity of the first and third conductive layers, and
    a thickness of the lower insulating layer below the vertical insulating layer is smaller than a thickness of the lower insulating layer below the lower electrode.

19. The device of claim 12, wherein
the lower electrode structure includes a first conductive layer, a second conductive layer on the first conductive layer, and a third conductive layer on the second conductive layer, the second conductive layer including a conductive material having an electric resistivity smaller than an electric resistivity of the first and third conductive layers.

* * * * *